(12) United States Patent
Choi et al.

(10) Patent No.: US 12,745,587 B2
(45) Date of Patent: Sep. 22, 2026

(54) APPARATUS FOR TREATING SUBSTRATE

(71) Applicant: SEMES CO., LTD., Cheonan-si (KR)

(72) Inventors: Jun Young Choi, Cheongju-si (KR); Kyu Hwan Chang, Cheonan-si (KR); Chul Goo Kim, Sejong-si (KR); Jung Bong Choi, Suwon-si (KR); Young Il Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 604 days.

(21) Appl. No.: 17/876,527

(22) Filed: Jul. 28, 2022

(65) Prior Publication Data

US 2023/0033534 A1 Feb. 2, 2023

(30) Foreign Application Priority Data

Jul. 29, 2021 (KR) ........................ 10-2021-0100118

(51) Int. Cl.
*H10P 72/00* (2026.01)
*B08B 3/02* (2006.01)
(Continued)

(52) U.S. Cl.
CPC .......... *H10P 72/0416* (2026.01); *B08B 3/024* (2013.01); *B08B 3/04* (2013.01); *B08B 3/10* (2013.01); *B08B 11/02* (2013.01); *B08B 13/00* (2013.01); *H10P 70/20* (2026.01); *H10P 72/0408* (2026.01); *H10P 72/0414* (2026.01);
(Continued)

(58) Field of Classification Search
CPC ......... H01L 21/67057; H01L 21/67051; H01L 21/67103; H01L 21/67173; H01L 21/67178; H01L 21/67718; H01L 21/67748; H01L 21/67754; H01L 21/67757; H01L 21/02057; H01L 21/67034; H01L 21/67265; H01L 21/6732; H01L 21/67742; H01L 21/67745; H01L 21/67778; H01L 21/68707; B08B 3/024;
(Continued)

(56) References Cited

U.S. PATENT DOCUMENTS 5,485,644 A * 1/1996 Shinbara .................. B08B 1/36 15/21.1
5,488,964 A * 2/1996 Murakami ........ H01L 21/67051 134/155
(Continued)

FOREIGN PATENT DOCUMENTS

| JP | 61100937 | 5/1986 |
|---|---|---|
| JP | 722375 | 1/1995 |

(Continued)

OTHER PUBLICATIONS

JP5965316 translation (Year: 2016).*
(Continued)

*Primary Examiner* — Michael E Barr
*Assistant Examiner* — Lauren G Orta

(57) ABSTRACT

The inventive concept provides a substrate treating apparatus. The substrate treating apparatus includes a treating bath for liquid treating a plurality of substrates and having an accommodation space for accommodating a treating liquid; and a posture changing member for changing a posture of a substrate which is immersed in the treating liquid from a vertical posture to a horizontal posture.

16 Claims, 24 Drawing Sheets

(51) Int. Cl.
*B08B 3/04* (2006.01)
*B08B 3/10* (2006.01)
*B08B 11/02* (2006.01)
*B08B 13/00* (2006.01)
*H10P 70/00* (2026.01)
*H10P 72/10* (2026.01)
*H10P 72/30* (2026.01)
*H10P 72/76* (2026.01)

(52) U.S. Cl.
CPC ...... *H10P 72/0432* (2026.01); *H10P 72/0456* (2026.01); *H10P 72/0458* (2026.01); *H10P 72/0608* (2026.01); *H10P 72/14* (2026.01); *H10P 72/3211* (2026.01); *H10P 72/3302* (2026.01); *H10P 72/3304* (2026.01); *H10P 72/3306* (2026.01); *H10P 72/3311* (2026.01); *H10P 72/3312* (2026.01); *H10P 72/3411* (2026.01); *H10P 72/7602* (2026.01)

(58) Field of Classification Search
CPC .. B08B 3/04; B08B 13/00; B08B 3/10; B08B 11/02
See application file for complete search history.

(56) References Cited

U.S. PATENT DOCUMENTS 5,671,764 A 9/1997 Murakami et al.
5,678,320 A * 10/1997 Thompson ........ H01L 21/67775 34/58
5,782,990 A 7/1998 Murakami et al.
5,887,604 A 3/1999 Murakami et al.
6,052,855 A * 4/2000 Terui ......................... B08B 3/04 15/88.1
6,643,882 B1 * 11/2003 Sotozaki ................. B08B 3/024 451/65
2001/0010103 A1 * 8/2001 Konishi ............ H01L 21/67051 15/97.1
2012/0006726 A1 * 1/2012 Kusuhara ............... B65G 59/02 414/801
2015/0004741 A1 1/2015 Kusuhara et al.
2015/0013606 A1 * 1/2015 Terada ................ H01L 21/6715 118/725
2017/0062264 A1 * 3/2017 Tang ................. H01L 21/68707
2018/0147599 A1 * 5/2018 Tanaka ..................... B05D 1/36
2020/0168483 A1 * 5/2020 Doong .............. H01L 21/67057

FOREIGN PATENT DOCUMENTS

JP 2007141926 6/2007
JP 5965316 B2 * 8/2016 ....... H01L 21/67092
KR 1020060073468 6/2006
KR 10-2011-0104994 9/2011
KR 101580712 7/2013
KR 1020150088792 8/2015
KR 1020170134091 12/2017
KR 10-2018-0076157 7/2018
KR 20180076157 A * 7/2018 ....... H01L 21/67057
KR 1020200060280 5/2020

OTHER PUBLICATIONS

KR20180076157 translation. This version includes paragraph numbers. (Year: 2018).*
KR20180076157 translation. This version verifies the liquid within tank 100. (Year: 2018).*
Office Action from the Japan Patent Office dated Aug. 29, 2023.

* cited by examiner 10
100
110
120
122
124
130
132
140
141
142
143
150
152
200
210
220
222
230
240
250
260
262
270
600
C
W
F
X
Y
Z 600
10
132
130
220
222
240
230
120
C
W
124
C
122
W
C
152
141
142
143
140
150
210
250
260
262
110
F
F
270
Y
Z
X
100
200

10
100
110
120
122
124
130
132
140
141
142
143
150
152
200
210
220
222
230
240
250
260
262
270
600
C
W
F
X
Y
Z

APPARATUS FOR TREATING SUBSTRATE

CROSS-REFERENCE TO RELATED APPLICATIONS

A claim for priority under 35 U.S.C. § 119 is made to Korean Patent Application No. 10-2021-0100118 filed on Jul. 29, 2021, in the Korean Intellectual Property Office, the entire contents of which are hereby incorporated by reference.

BACKGROUND

Embodiments of the inventive concept described herein relate to a substrate treating apparatus.

Various processes such as a photolithography process, an etching process, an ashing process, an ion implantation process, and a thin film deposition process are carried out to manufacture a semiconductor device. At each of the processes, various treating liquids and treating gases are used and during a treating process, particles and process by-products are generated. To remove such thin films, particles, and process by-products, a liquid treatment is performed before and after each of the processes. In a conventional liquid treatment process, the substrate is treated with chemicals and a rinsing liquid before a drying treatment. The liquid treatment process may strip a SiN from the substrate.

Furthermore, the method of treating a substrate with a chemical and a rinsing liquid may be largely divided into a batch-type treating method of collectively treating a plurality of substrates, and a single-type treating method of treating one substrate at a time respectively.

In the batch-type treating method for collectively treating a plurality of substrates, the substrate treatment is performed by collectively immersing a plurality of substrates in a treating bath in which the chemical or the rinsing liquid is stored in a vertical posture. For this reason, throughput of the substrate treatment is outstanding, and the treating quality between each substrate is uniform. However, in the batch-type treating method, a plurality of the substrates having patterns on the top surface thereof are immersed in a vertical posture. Accordingly, when the patterns on the substrate have a high aspect ratio, a pattern leaning phenomenon may occur during a process such as lifting the substrate. In addition, if the drying treatment is not performed within a short time after the plurality of the substrates are exposed to the air, a water mark may be generated on some of the plurality of substrates exposed to the air.

On the other hand, in the case of a single-type treating method treating the substrate one by one, the substrate treatment is performed by supplying the chemical or the rinse liquid to a single substrate rotating in a horizontal posture. In addition, in the single-type treating method, the risk of the pattern leaning described above is low because the transferred substrate maintains a horizontal posture, and the risk of occurrence of the aforementioned watermark is low because the substrate is dry treated, or liquid treated immediately after treatment one by one. However, in the case of the single-type treating method, the throughput of the substrate treatment is poor, and the treating quality between each substrate is relatively uneven compared to the batch-type treating method.

In addition, when the substrate is rotated and spin-dried, if the pattern formed on the substrate has a high aspect ratio, there is a concern that a leaning phenomenon, in which the pattern on the substrate collapses, may occur.

SUMMARY

Embodiments of the inventive concept provide a substrate treating apparatus for efficiency treating a substrate.

Embodiments of the inventive concept provide a substrate treating apparatus which can improve throughput of substrate treatment.

Embodiments of the inventive concept provide a substrate treating apparatus which can improve a uniformity of a treating quality between each substrate.

Embodiments of the inventive concept provide a substrate treating apparatus for minimizing a risk of a watermark occurring on the substrate.

Embodiments of the inventive concept provide a substrate treating apparatus for minimizing a risk of a pattern leaning phenomenon occurring on the substrate.

Embodiments of the inventive concept provide a substrate treating apparatus for efficiently treating a substrate with a pattern having a high aspect ratio.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a treating bath for liquid treating a plurality of substrates and having an accommodation space for accommodating a treating liquid; and a posture changing member for changing a posture of a substrate which is immersed in the treating liquid from a vertical posture to a horizontal posture.

In an embodiment, the substrate treating apparatus further includes a wetting module installed above the treating bath for spraying a wetting liquid on a substrate exposed to an outside and away from the treating liquid.

In an embodiment, the wetting module comprises a wetting nozzle configured to spray the wetting liquid in a stream method or a spray method.

In an embodiment, a wetting liquid sprayed from the wetting module is a liquid which is the same type as a treating liquid accommodated at the accommodation space.

In an embodiment, the wetting module comprises a moving member for moving the wetting nozzle along a direction of a radius of a substrate when seen from above.

In an embodiment, the substrate treating apparatus further includes: a buffer part for temporarily storing a substrate; and a transfer unit for transferring a substrate exposed to an outside away from the treating liquid accommodated at the accommodation space to a buffer part.

In an embodiment, the buffer part includes: a support shelf for supporting the substrate; a wetting nozzle for spraying a wetting liquid to a substrate supported by the support shelf; and a drain partition positioned at below the substrate supported by the support shelf for draining the wetting liquid.

In an embodiment, the wetting nozzle is provided in a plurality and any one among the plurality of wetting nozzles and another one among the plurality of wetting nozzles are installed in a position facing one another.

In an embodiment, the support shelf, the wetting nozzle, the drain partition are each provided in a plurality having a number corresponding to the substrate, and the transfer unit comprises a batch-type hand for transferring a plurality of substrates, and wherein a space between the plurality of substrates gripped by the batch-type hand is the same as a space between the support shelves.

In an embodiment, a wetting liquid sprayed by the wetting nozzle is a liquid which is the same type as a treating liquid accommodated at the accommodation space.

In an embodiment, the substrate treating apparatus further includes a storage container which is immersed in the treating liquid accommodated at the accommodation space and having a storage space for storing substrates; and a lifting/lowering member for moving a substrate stored at the storage space and changed to the horizontal posture in an up/down position, and wherein the posture change member comprises: a rotating portion which is mountable on the storage container for rotating the storage container; and a moving portion installed at the treating bath for moving the storage container mounted on the rotating portion in the horizontal direction, and wherein a side of the storage container is opened and faces the wetting module when the storage container rotates and a posture of the substrate changes to the horizontal posture.

In an embodiment, the substrate treating apparatus further includes a transfer unit having a hand for transferring the substrate; and a controller, and wherein the controller configured to control the lifting/lowering member and the transfer unit so the lifting/lowering member moves the storage container in an upward direction to take out the substrate exposed to the outside from the storage container.

The inventive concept provides a substrate treating apparatus. The substrate treating apparatus includes a first treating part for liquid treating a plurality of substrates in a batch-type method; and a second treating part for liquid treating or dry treating one substrate in a single-type method, and wherein the first treating part comprises: a treating bath having an accommodation space for accommodating a treating liquid; and a posture change member for changing a posture of a substrate immersed in the treating liquid from a vertical posture to a horizontal posture.

In an embodiment, the first treating part further comprises a lifting/lowering member for moving a substrate changed to the horizontal posture in an upward direction so it deviates from the treating liquid accommodated at the accommodation storage space to be exposed to an outside.

In an embodiment, the first treating part includes a plurality of storage containers having a storage space for storing a substrate, and wherein the posture change member converts the stored substrates by rotating one among the storage container to a horizontal position, and the lifting/lowering member moves the substrate converted to the horizontal state and stored at the storage container to the up/down direction.

In an embodiment, the second treating part comprises a buffer part for temporarily storing the substrate, and wherein the first treating part further comprises a first transfer unit for transferring a substrate exposed to an outside away from the treating liquid accommodated at the accommodation space to the buffer part by the lifting/lowering member.

In an embodiment, the second treating part includes a single-type treating chamber for treating the substrate in the single-type method; and a second transfer unit for transferring the substrate between the buffer part and the single-type treating chamber, and wherein the second transfer unit comprises a plurality of transfer hands for transferring the single-type treating chamber by taking out the plurality of substrates from the buffer part.

In an embodiment, the buffer part is positioned to be stacked with the single-type treating chamber for treating the substrate in the single-type method, and positioned above of the single-type treating chamber.

The inventive concept provides a substrate treating apparatus. The substrate treating apparatus includes a first treating part for liquid treating a plurality of substrates in a batch-type method; and a second treating part for treating a substrate treated at the first treating part and for liquid treating or dry treating one substrate in a single-type method, and wherein the first treating part comprises: a plurality of treating baths having an accommodation space for accommodating a treating liquid; a posture change member for changing a posture of a substrate immersed in the treating liquid from a vertical posture to a horizontal posture; and a wetting module installed above of the treating bath and spraying a wetting liquid to a substrate exposed to an outside and away from a treating liquid accommodated at the accommodation space, and wherein a treating liquid accommodated at any one treating bath of among the plurality of treating baths is the same type as a wetting liquid sprayed by the wetting module, and a treating liquid accommodated at any other treating bath among the plurality of treating baths is different from the wetting liquid sprayed by the wetting module.

In an embodiment, the second treating part further includes a buffer part for temporality storing a substrate, and wherein the first treating part comprises a storage container having a storage space immersed in the treating liquid accommodated at the accommodation space and rotated by the posture change member; a lifting/lowering member for moving the storage container rotated by the posture change member in an up/down direction; and a transfer member transferring a substrate exposed to an outside by the lifting/lowering member and having a batch-type hand for transferring the plurality of substrates, and wherein the buffer part comprises: a plurality of support shelves; second wetting nozzles for spraying the wetting liquid to each substrate supported by the plurality of support shelves; drain partitions positioned below each substrate supported by a support shelf and draining the wetting liquid; and a sensor installed at the support shelf and sensing whether the substrate is supported.

According to an embodiment of the inventive concept, the substrate may be treated efficiently.

According to an embodiment of the inventive concept, the mass producing of the substrate treatment may be improved.

According to an embodiment of the inventive concept, uniformity of a treating quality between each substrate may be improved.

According to an embodiment of the inventive concept, a risk of a watermark occurring on the substrate may be minimized.

According to an embodiment of the inventive concept, a risk of a pattern leaning phenomenon occurring on the substrate may be minimized.

According to an embodiment of the inventive concept, a substrate with a pattern formed having a high aspect ratio may be efficiently treated.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
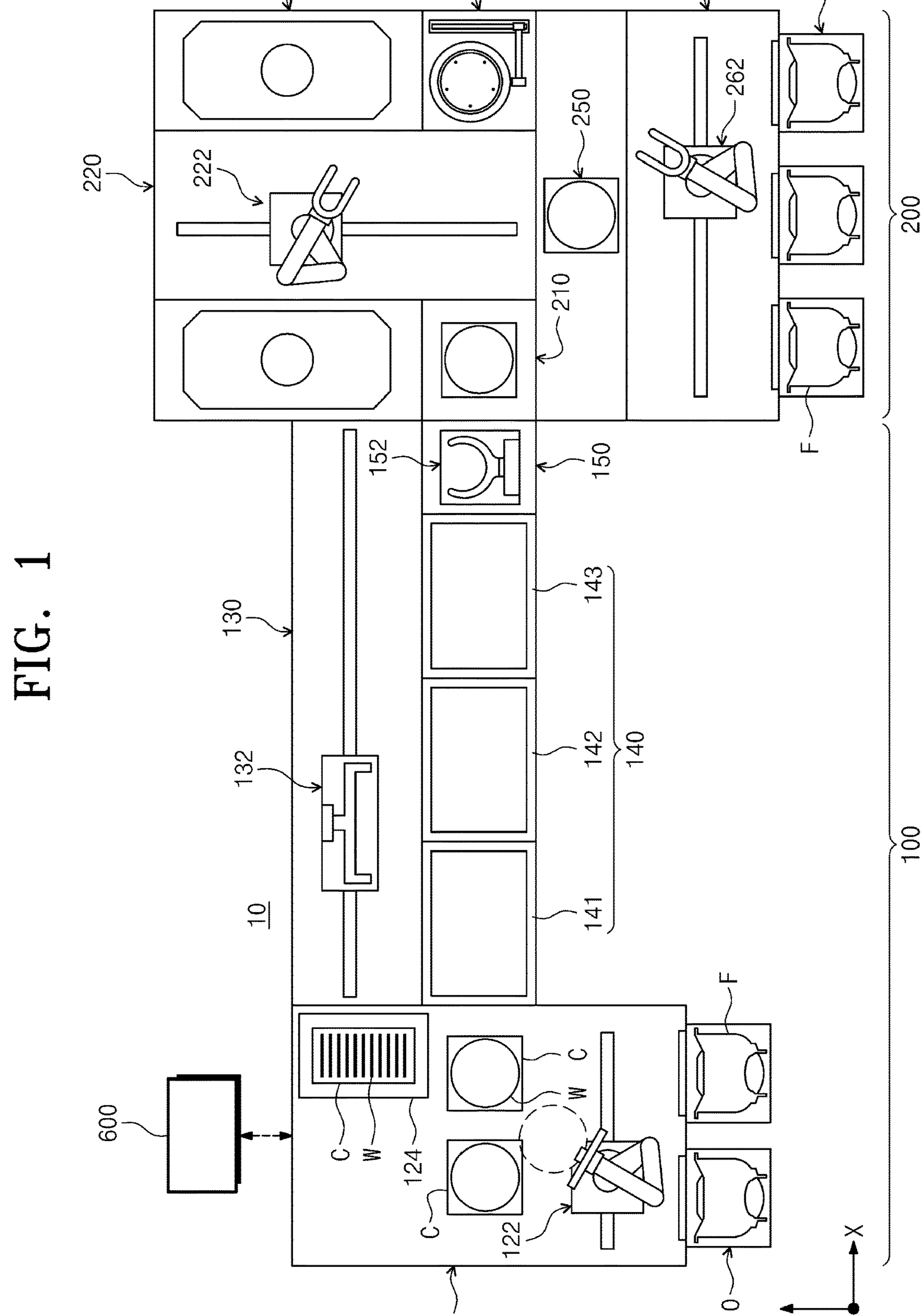
FIG. 1 is a schematic view of a substrate treating apparatus according to an embodiment of the inventive concept viewed from above.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Singular expressions include plural expressions unless they explicitly have a different meaning in the context. In addition, the shape and size of the elements in the drawings may be exaggerated for clearer explanation.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or component is referred to as being "on", "connected to", "coupled to", or "adjacent to" another element or component, it can be directly on, connected, coupled, or adjacent to the other element or component, or intervening elements or components may be present. In contrast, when an element is referred to as being "directly on," "directly connected to", "directly coupled to", or "immediately adjacent to" another element or component, there are no intervening elements or components present. Other expression explaining the relationship between elements such as when an element is referred to as being "between" another two elements, it can be directly between another two elements or indirectly between another two elements.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

In addition, components for transferring a substrate W which will be described below, such as a transfer unit or transfer robots in the following, may be referred to as a transfer module.

Hereinafter, an embodiment of the inventive concept will be described with reference to FIG. 1 to FIG. 15.

Figure 2:
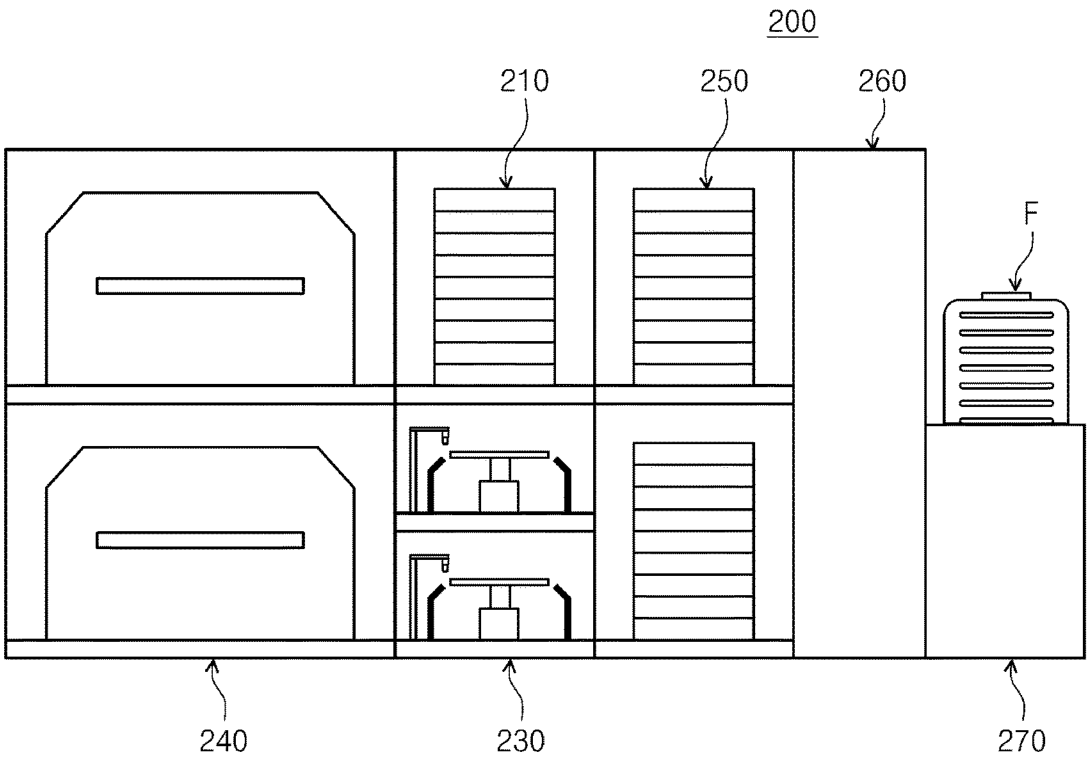
FIG. 2 is a side view of a second treating part of FIG. 1 viewed from a direction.
Figure 3:
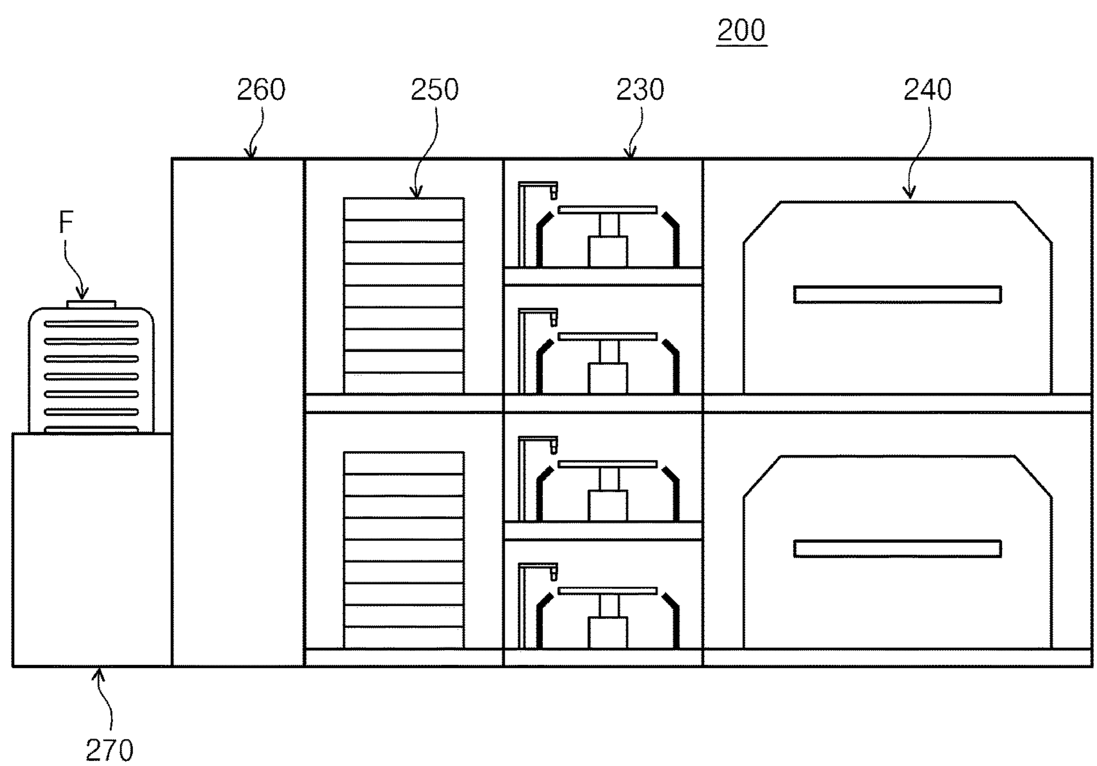
FIG. 3 is a side view of the second treating part of FIG. 1 viewed from another direction.

FIG. 1 illustrates a substrate treating apparatus according to an embodiment of the inventive concept viewed from above, FIG. 2 illustrates a second treating part of FIG. 1 viewed from one direction, and FIG. 3 illustrates the second treating part of FIG. 1 viewed from another direction.

Referring to FIG. 1, FIG. 2, and FIG. 3, a substrate treating apparatus 10 according to an embodiment of the inventive concept may include a first treating part 100, a second treating part 200, and a controller 600. The first treating part 100 and the second treating part 200 may be arranged along a first direction X when viewed from above. Hereinafter, a direction perpendicular to the first direction X is referred to as a second direction Y, and a direction perpendicular to the first direction X and the second direction Y is referred to as a third direction Z.

The first treating part 100 may collectively liquid-treat a plurality of substrates W in a batch-type method. For example, the first treating part 100 may collectively clean-treat a plurality of substrates W in a batch-type method. In the first treating part 100, multiple substrates W in a vertical posture (a posture in which a top surface or a bottom surface of the substrate W is parallel to a direction perpendicular to the ground) may be simultaneously treated. The first treating part 100 may include a first load port unit 110, a first index chamber 120, a first transfer chamber 130, a batch-type liquid treating chamber 140, and a second transfer chamber 150.

The first load port unit 110 may include at least one load port. A container F in which at least one substrate W is stored may be placed in the load ports of the first load port unit 110. A plurality of substrates W may be stored in the container F. For example, 25 substrates may be stored in the container F. The container F may be referred to as a cassette, a POD, a FOUP (Front Opening Unified Pods), or the like. The container F may be loaded into the first load port unit 110 by a container transfer device. The substrates W stored in the container F placed on the first load port unit 110 may be untreated substrates W or substrates W requiring liquid treatment (wafer to be liquid-treated). In addition, only the container F in which the untreated substrate W is stored may be placed in the first load port unit 110. That is, the first load port unit 110 may serve to load the substrate W requiring treating.

The first load port unit 110 may be coupled to the first index chamber 120. The first index chamber 120 and the first load port unit 110 may be arranged in the second direction Y. The first index chamber 120 may include a first transfer robot 122 and a posture changing unit 124. The first transfer robot 122 may take out an untreated or treatment requiring substrate (wafer to be treated) W from the container F seated on the first load port unit 110. The first transfer robot 122 may take the substrate W out of the container F and bring the substrate W into the storage container C provided in the first index chamber 120. The first transfer robot 122 may have a batch-hand capable of simultaneously gripping and transferring a plurality of substrates (e.g., 25 wafers).

The storage container C may be a substantially container shape. The storage container C may have a storage space therein. A plurality of the substrates W may be stored in the storage space of the storage container C. For example, 50 substrates W may be stored in the storage space of the storage container C. The storage container C may be a container having at least two open sides among the sides of the storage container C. A support member for supporting/retaining the substrate W may be provided in the storage space of the storage container C.

When the substrate W taken out from the container F is completely brought into the storage container C, the storage container C may be returned to the posture changing unit 124 disposed in the first index chamber 120. The posture change unit 124 may rotate the storage container C. For example, the posture changing unit 124 may rotate the storage container C such that the open side of the storage container C faces upward. When the storage container C rotates such that open side of the storage container C face upward, the posture of the substrate W stored in the storage container C may be changed from a horizontal posture (a posture in which the top surface and the bottom surface are horizontal to the ground) to a vertical posture. The horizontal posture may mean a state in which a top surface of the substrate W (e.g., the surface in which a pattern is formed) is parallel to the X-Y plane, and the vertical posture may mean a state in which the top surface of the substrate W is parallel to the X-Z plane or the Y-Z plane.

A first transfer chamber 130 may be connected to the first index chamber 120. The first transfer chamber 130 may include a first transfer unit 132. The first transfer unit 132 may include a transfer hand capable of transferring an object. In addition, the transfer hand of the first transfer unit 132 may be provided to be movable along the first direction X, the second direction Y, and the third direction Z. In addition, the transfer hand of the first transfer unit 132 may be provided to be rotatable about the third direction Z as a rotation axis. The first transfer unit 132 may take out at least one substrate W from the first index chamber 120 and insert the same into a batch-type liquid treating chamber 140 to be described later. For example, the first transfer unit 132 may take a plurality of substrates W out of the first index chamber 120 at once and put them into a batch-type liquid treating chamber 140 to be described later. For example, the hand of the first transfer unit 132 may take out the storage container C rotated by the posture changing unit 124 from the first index chamber 120 and bring the taken-out storage container C into the batch-type liquid treating chamber 140.

The batch-type liquid treating chamber 140 may be disposed in parallel with the first transfer chamber 130 when viewed from above.

The batch-type liquid treating chamber 140 may liquid-treat a plurality of substrates W at once. The batch-type liquid treating chamber 140 may clean a plurality of substrates W at once using the treating liquid. The batch-type liquid treating chamber 140 may liquid-treat a plurality of substrates W at once using the treating liquid. The treating liquid used in the batch-type liquid treating chamber 140 may be a chemical and/or rinsing liquid. For example, the chemical may be a chemical with a strong acid or strong alkali properties. In addition, the rinsing liquid may be pure water. For example, the chemical may be selected from APM (Ammonia-Hydrogen Peroxide Mixture), HPM (Hydrochloric acid-Hydrogen Peroxide Mixture), FPM (Hydrofluoric acid-Hydrogen Peroxide Mixture), DHF (Diluted Hydrofluoric Acid), a chemical removing SiN, a chemical including phosphoric acid, or a chemical including sulfuric acid. The rinsing liquid may be a liquid including a water. The rinsing liquid may be appropriately selected from a pure water or an ozone water, etc. In addition, the batch-type liquid treating chamber 140 may include a first batch-type liquid treating chamber 141, a second batch-type liquid treating chamber 142, and a third batch-type liquid treating chamber 143. The first batch-type liquid treating chamber 141 and the second batch-type liquid treating chamber 142 may treat the substrate W using a chemical. The third batch-type liquid treating chamber 143 may rinse-treat the substrate W using a rinsing liquid.

In addition, a treating liquid used in the first batch-type liquid treating chamber 141, a treating liquid used in the second batch-type liquid treating chamber 142 and a treating liquid used in the third batch-type liquid treating chamber 143 may be different from each other.

In addition, after treating the substrate W in the first batch-type liquid treating chamber 141 and/or the second batch-type liquid treating chamber 142, the above-described first transfer unit 132 may return the storage container C containing substrates which have been chemical-treated to the third batch-type liquid treating chamber 143 to treat the substrate W stored in the storage container C with a rinsing liquid. Details of the batch-type liquid treating chamber 140 will be described later.

When viewed from above, the second transfer chamber 150 may be arranged in parallel with the first transfer chamber 130 and the batch-type liquid treating chamber 140. For example, the second transfer chambers 150 may be arranged in parallel with the first transfer chamber 130 in the second direction Y. In addition, the second transfer chamber 150 may be arranged in parallel with the batch-type liquid treating chamber 140 in the first direction X. In addition, the second transfer chamber 150 may be disposed between the third batch-type liquid treating chamber 143 and the second treating part 200. For example, the second transfer chamber 150 may be disposed between the third batch-type liquid treating chamber 143 and a first buffer part 210 of the second treating part 200 to be described later.

The second transfer chamber 150 may transfer the substrate W. The second transfer chamber 150 may take out the substrate W from the batch-type liquid treating chamber 140 and return the substrate W to the first buffer part 210 to be described later. The second transfer chamber 150 may include a second transfer unit 152 having a transfer hand. The transfer hand of the second transfer unit 152 may be provided to be movable along the first direction X, the second direction Y, and the third direction Z. In addition, the transfer hand of the second transfer unit 152 may be provided to be rotatable about the third direction Z as an axis. In addition, the transfer hand of the second transfer unit 152 may take out the substrate W from the third batch-type liquid treating chamber 143 included in the batch-type liquid treating chamber 140 and transfer the substrate W to the first buffer part 210. In addition, the transfer hand of the second transfer unit 152 may take out the substrate W in a horizontal posture from the third batch-type liquid treating chamber 143 and transfer the same to the first buffer part 210. The second transfer unit 152 may take out the substrate W at a position higher than a top end of the third batch-type liquid treating chamber 143 to be described later and take in into the first buffer part 210 to be described later.

The second treating part 200 may treat the substrate W which has been treated by the first treating part 100. The second treating part 200 may treat the substrate W which has been treated by the first treating part 100, and may perform a single-type liquid treatment or a single-type drying treatment on the substrate W. The second treating part 200 may include the first buffer part 210, a third transfer chamber 220, a single-type liquid treating chamber 230, a drying chamber 240, a second buffer part 250, a second index chamber 260, and a second load port unit 270. Both the single-type liquid treating chamber 230 and the drying chamber 240 may be referred to as a single-type treating chamber.

When viewed from above, the first buffer part 210 may be arranged in parallel with the second transfer chamber 150 in the first direction X. For example, the first buffer part 210 may be disposed on one side of the second transfer chamber 150. The first buffer part 210 may have a storage space for temporarily storing substrates W which have been liquid-treated in the first treating part 100. The first buffer part 210 may store substrates W in a horizontal posture whose position has been changed from a vertical position in a third batch-type liquid treating chamber 143.

In addition, the first buffer part 210 may be disposed to be stacked with at least some of the single-type treating chambers. For example, the drying chamber 240 or the single-type liquid treating chamber 230 to be described later may be disposed under the first buffer part 210. For example, the single-type liquid treating chamber 230 to be described later may be disposed under the first buffer part 210. One or a plurality of single-type liquid treating chambers 230 may be disposed under the first buffer part 210. That is, the first buffer part 210 is provided to be stacked with a single-type treating chamber so as to directly store the substrate W transferred by the second transfer unit 152, and may be disposed above the single-type treating chamber.

When viewed from above, the third transfer chamber 220 may be disposed between the drying chambers 240 to be described later. In addition, the third transfer chamber 220 may be disposed between first buffer part 210 and the single-type liquid treating chamber 230 to be described later when viewed from above. The third transfer chamber 220 may include a third transfer unit 222. The third transfer unit 222 may include a transfer hand that takes out the substrate W from the first buffer part 210 and transfers the substrate W to the drying chamber 240 or the single-type liquid treating chamber 230. The hand of the third transfer chamber 220 may be a single-type hand that transfers one substrate at a time. The transfer hand of the third transfer unit 222 may be provided to be movable along the first direction X, the second direction Y, and the third direction Z. In addition, the transfer hand of the third transfer unit 222 may be provided rotatable about the third direction Z as a rotation axis.

The single-type liquid treating chamber 230 may be disposed on one side and on another side of the third transfer chamber 220 when viewed from above. Some of the single-type liquid treating chambers 230 may be disposed to be stacked with the first buffer part 210 as described above. Some of the single-type liquid treating chambers 230 may be disposed below the first buffer part 210.

The single-type liquid treating chamber 230 rotates the horizontal posture-substrate W, and supplies the treating liquid to the rotating substrate W in the horizontal posture to treat the substrate W. The substrate W may be processed one at a time at the single-type liquid treating chamber 230. The treating liquid supplied from the single-type liquid treating chamber 230 may be an organic solvent. For example, the treating liquid supplied from the single-type liquid treating chamber 230 may be isopropyl alcohol (IPA). The single-type liquid treating chamber 230 may supply an organic solvent to the rotating substrate W, and rotate the substrate W to dry-treat the substrate W. Alternatively, the single-type liquid treating chamber 230 supplies an organic solvent to the rotating substrate W, and the substrate W is returned to the drying chamber 240 to be described later while wetted with the organic solvent, so that the substrate W may be dried in the drying chamber 240. The single-type liquid treating chamber 230 will be described later in detail.

The drying chamber 240 may treat the substrate W using a supercritical fluid. The drying chamber 240 may be a supercritical chamber for drying one substrate W in a single-type manner. The drying chamber 240 may be a supercritical chamber for drying the substrate W using a supercritical fluid. The drying chamber 240 will be described later in detail.

The second buffer part 250 may be disposed between the single-type liquid treating chamber 230 and the second index chamber 260 to be described later. The second buffer part 250 may be disposed between the single-type treating chamber and the second load port unit 270.

Similar to the first buffer part 210, the second buffer part 250 may provide a space in which the substrate W is temporarily stored, or stayed. For example, the second buffer part 250 may temporarily store the substrate W which has been treated in the single-type liquid treating chamber 230 and/or the drying chamber 240. As shown in FIG. 2, the second buffer part 250 may have a multilayer structure. However, the inventive concept is not limited thereto, and the second buffer part 250 may have a single-layer structure.

The second index chamber 260 may be arranged in a line with the second buffer part 250 and the third transfer chamber 220. The second index chamber 260 may be arranged in a line with the second buffer part 250 and the third transfer chamber 220 in the second direction Y. The third transfer unit 222 of the third transfer chamber 220 may carry out the substrate W in the horizontal posture which has been treated by the single-type liquid treating chamber 230 or the drying chamber 240 and may transfer the carried-out substrate W to the second buffer part 250. The second transfer robot 262 of the second index chamber 260 may take out the substrate W from the second buffer part 250.

The hand of the second transfer robot 262 may be a single-type hand that transfers one substrate at a time. The transfer hand of the second transfer robot 262 may be provided to be movable along the first direction X, the second direction Y, and the third direction Z. In addition, the transfer hand of the second transfer robot 262 may be provided rotatable about the third direction Z as a rotation axis.

The second load port unit 270 may include at least one load port. A container F for storing a plurality of substrates W may be disposed in a load port of the second load port unit 270. For example, the container F placed on the second load port unit 270 may store substrates W that have been treated in the first treating part 100 and the second treating part 200. In the container F placed on the second load port unit 270, only the substrate W that has been treated in the first treating part 100 and the second treating part 200 may be stored. That is, the second load port unit 270 may perform a function of unloading the treated substrate W from the substrate treating apparatus.

The above-described second transfer robot 262 may bring the treated substrate W into the container F placed in the load port of the second load port unit 270. The container F may be returned to the outside of the substrate treating apparatus 10 by the above-described article transfer apparatus (e.g., OHT, Overhead Transport Apparatus).

The controller 600 may control the substrate treating apparatus 10. For example, the controller 600 may control components of the substrate treating apparatus 10. For example, the controller 600 may control the substrate treating apparatus 10 so that the substrate treating apparatus 10 may perform a process of treating the substrate W. For example, the controller 600 may control the batch-type liquid treating chamber 140, the second transfer unit 152, the first buffer part 210, the third transfer unit 222, and the second transfer robot 262. In addition, the controller 600 may control a liquid supply source 315, a liquid discharge line 316, a posture changing member 330, a lifting/lowering member 340, and a heating member 320 to be described later.

In addition, the controller 600 may comprise a process controller consisting of a microprocessor (computer) that executes control of substrate treating apparatus 10, a user interface such as a keyboard via which an operator inputs commands to manage the substrate treating apparatus 10 and a display showing the operating situation of the substrate treating apparatus 10, and a memory unit storing a treating recipe, i.e., a control program to execute treating processes of the substrate treating apparatus 10 by controlling the process controller or a program to execute components of the substrate treating apparatus 10 according to data and treating condition. In addition, the user interface and the memory unit may be connected to the process controller. The treating recipe may be stored in a storage medium of the storage unit, and the storage medium may be a hard disk, a portable disk such as a CD-ROM, a DVD, or a semiconductor memory such as a flash memory.

Figure 4:
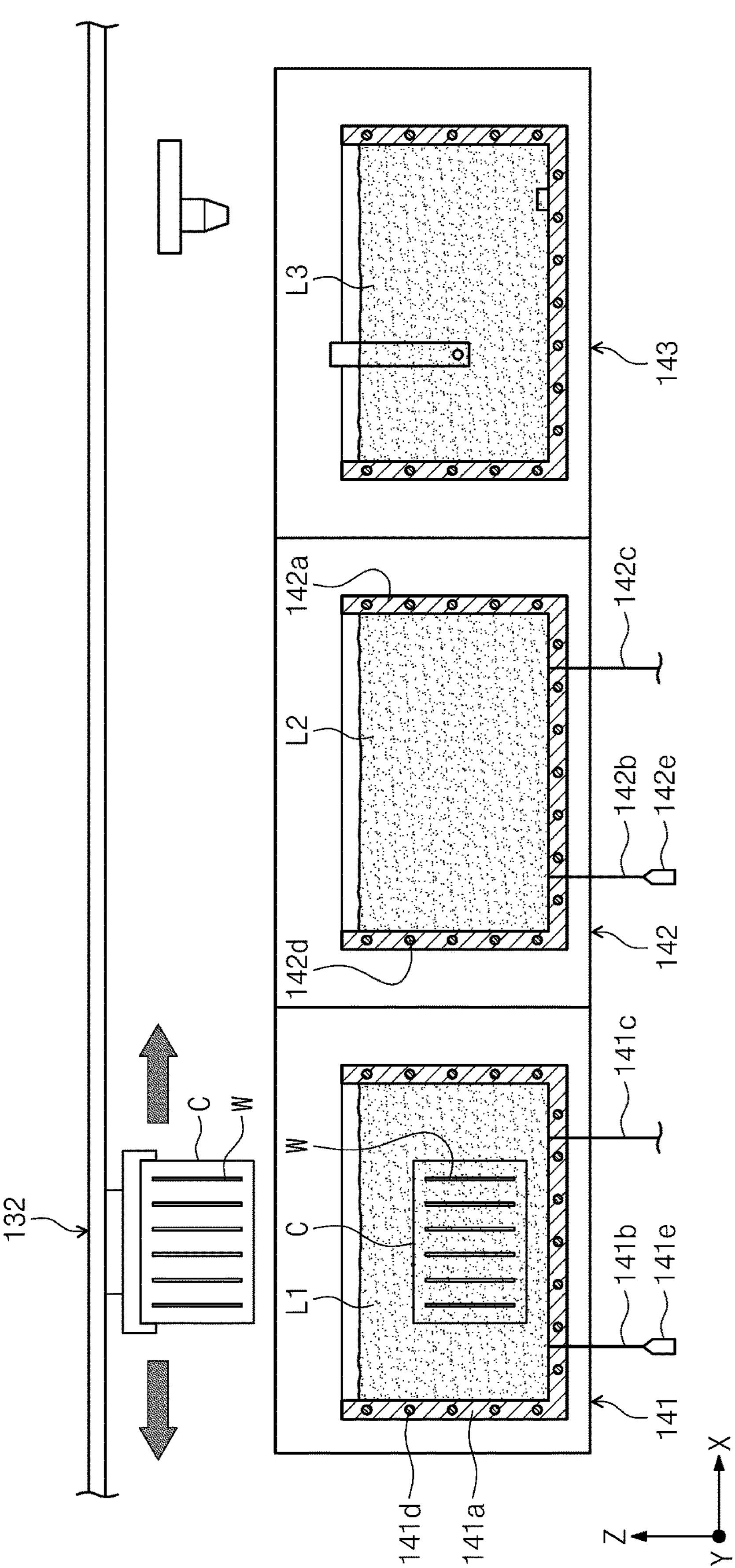
FIG. 4 is a schematic view of a batch-type liquid treating chamber and a first transfer chamber of FIG. 1 viewed from a side.

FIG. 4 illustrates schematically the batch-type liquid treating chamber and the first transfer chamber of FIG. 1 viewed from the side.

Referring to FIG. 4, the batch-type liquid treating chamber 140 may include a first batch-type liquid treating chamber 141, a second batch-type liquid treating chamber 142, and a third batch-type liquid treating chamber 143, as described above. The first batch-type liquid treating chamber 141, the second batch-type liquid treating chamber 142, and the third batch-type liquid treating chamber 143 may be arranged side by side along the first direction X.

The first batch-type liquid treating chamber 141 and the second batch-type liquid treating chamber 142 may have the same or similar structure. For example, the first batch-type liquid treating chamber 141 and the second batch-type liquid treating chamber 142 may have the same or similar structure as each other except for a different type of treating liquid being used. For example, the first batch-type liquid treating chamber 141 may treat the substrate W using a first treating liquid L1. For example, the second batch-type liquid treating chamber 142 may treat the substrate W using a second treating liquid L2. The first treating liquid L1 may be any one of the above-described chemicals. The second treating liquid L2 may be another one of the above-described chemicals.

The first batch-type liquid treating chamber 141 may include a first treating bath 141*a*, a first liquid supply line 141*b*, a first liquid discharge line 141*c*, a first heating member 141*d*, and a first liquid supply source 141*e*. The second batch-type liquid treating chamber 142 may include a second treating bath 142*a*, a second liquid supply line 142*b*, a second liquid discharge line 142*c*, a second heating member 142*d*, and a second liquid supply source 142*e*. The first liquid supply line 141*b*, the first liquid discharge line 141*c*, the first heating member 141*d*, and the first liquid supply source 141*e* may perform substantially the same or similar functions as the second treating bath 142*a*, the second liquid supply line 142*b*, the second heating member 142*d*, and the second liquid supply source 142*e*, respectively. Hereinafter, the first batch-type liquid treating chamber 141 will be mainly described.

The first treating bath 141*a* may have a containing space in which the first treating liquid L1 is contained. The first treating bath 141*a* may have a container shape with an open top. The first treating bath 141*a* may be provided with a heating member 141*d* for adjusting the temperature of the first treating liquid L1 contained in the containing space. In addition, the first liquid supply line 141*b* connected to the first liquid supply source 141*e* may supply the first treating liquid L1 to the containing space of the first treating bath 141*a*, and the first liquid discharge line 141*c* may discharge the first treating liquid L1 supplied to the containing space to the outside. In addition, the storage container F has a container shape with one open side and may have a storage space therein. Also, the storage container F may be immersed in the first treating liquid L1 supplied to the containing space of the first treating bath 141*a* while a plurality of substrates W are contained therein. Also, at least one penetration hole is formed at the storage container C, and the substrate W stored in the storage container C can be immersed in the first treating liquid L1. The substrates W treated with the first treating liquid L1 may be transferred to the second batch-type liquid treating chamber 142 and the third batch-type liquid treating chamber 143 in this order by the first transfer unit 132, so as to be treated with the second treating liquid L2 and the third treating liquid L3. The third treating liquid L3 may be the rinse liquid described above.

Figure 5:
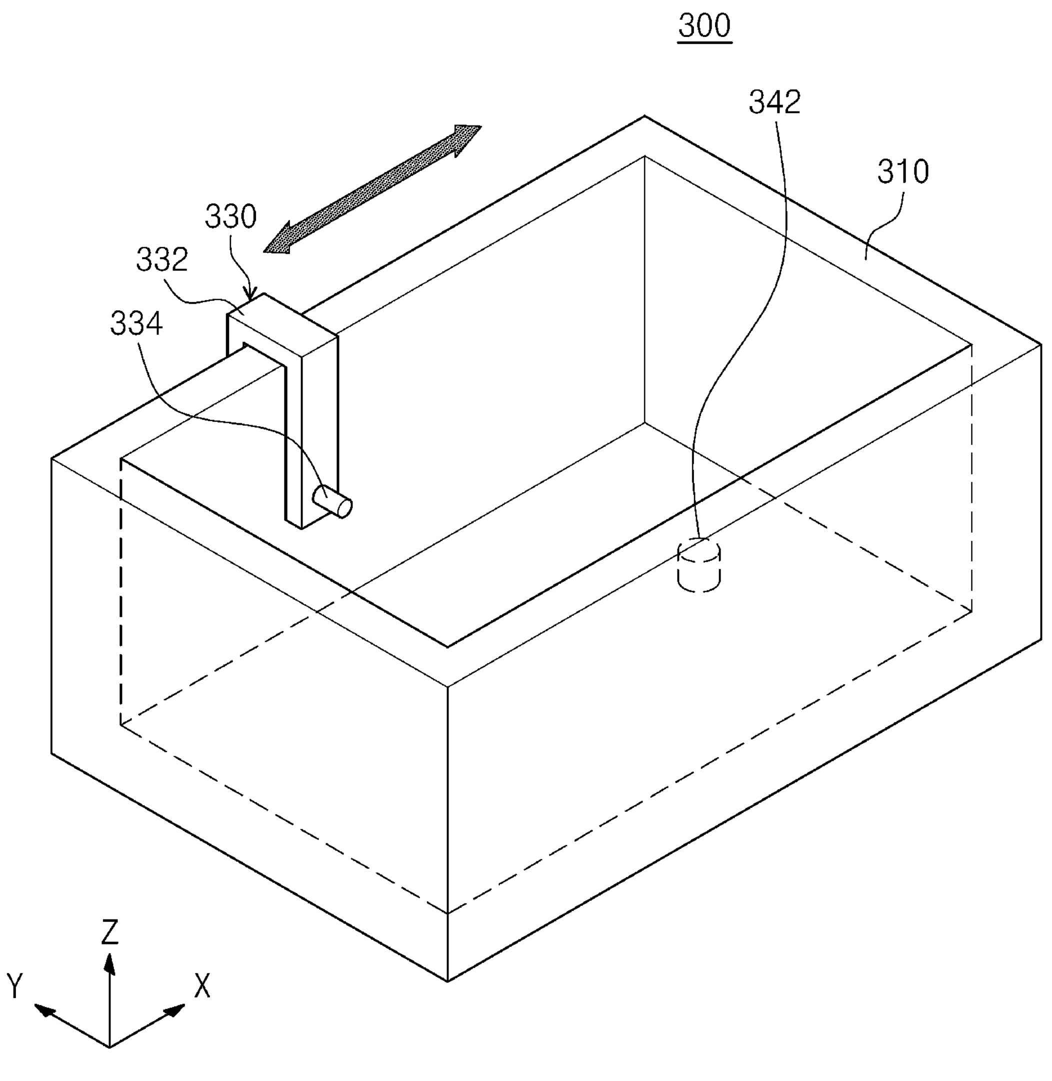
FIG. 5 is a perspective view illustrating the substrate treating apparatus provided in a third batch-type liquid treating chamber of FIG. 4.
Figure 6:
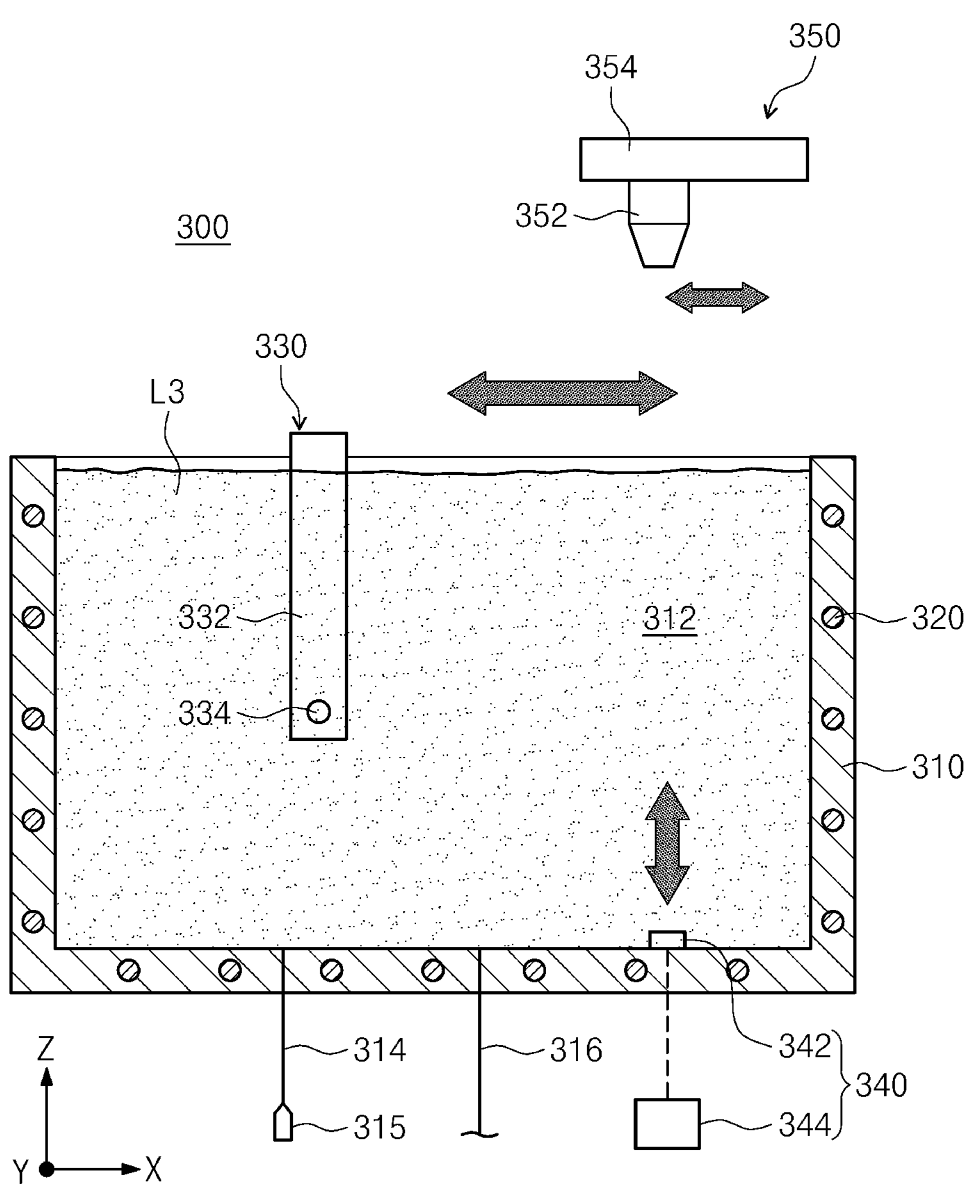
FIG. 6 is a cross-sectional view illustrating the substrate treating apparatus provided in the third batch-type liquid treating chamber of FIG. 4.

FIG. 5 is a perspective view illustrating a substrate treating apparatus provided in the third batch-type liquid treating chamber of FIG. 4, and FIG. 6 is a cross-sectional view illustrating a substrate treating apparatus provided in the third batch-type liquid treating chamber of FIG. 4. Referring to FIG. 5 and FIG. 6, the substrate treating apparatus 300 provided in the third batch-type liquid treating chamber 143 may include a treating bath 310, a liquid supply line 314, a liquid supply source 315, a liquid discharge line 316, a heating member 320, a posture changing member 330, a lifting/lowering member 340, and a wetting module 350.

The treating bath 310 may have a containing space 312 in which the third treating liquid L3 is contained. The treating bath 310 may have a container shape (e.g., rectangular container shape) with an open top. The treating bath 310 may include a bottom portion and a side portion upwardly extending from the edge area of the bottom portion.

In addition, the liquid supply source 315 may supply the treating liquid to the containing space 312. The liquid supply source 315 may supply the third treating liquid L3 to the containing space 312. The liquid supply source 315 may supply the rinse liquid to the containing space 312. The liquid supply source 315 may be connected to the liquid supply line 314. One end of the liquid supply line 314 may be connected to the containing space 312, and the other end of the liquid supply line 314 may be connected to the liquid supply source 315. The liquid supply source 315 may supply the rinse liquid to the liquid supply line 314, and the liquid supply line 314 may supply the rinse liquid to the containing space 312. In addition, the third treating liquid L3 used in the containing space 312 may be discharged to the outside through the liquid discharge line 316.

The heating member 320 may adjust the temperature of the third treating liquid L3 supplied to the containing space 312. For example, the heating member 320 may heat the third treating liquid L3 supplied to the containing space 312 to a set temperature. The heating member 320 may be provided at the bottom portion and side portion of the treating bath 310. For example, the heating member 320 may be buried within the bottom portion and side portion of the treating bath 310. The heating member 320 may control the temperature of the third treating liquid L3 supplied to the containing space 312 by generating a cooling heat or heating heat. The heating member 320 may be a heater. However, the inventive concept is not limited thereto, and the heating member 320 may be variously modified into a known device capable of adjusting a temperature of the third treating liquid L3 supplied to the containing space 312. Selectively, the heating member 320 may not be installed.

The posture changing member 330 may change a posture of a substrate immersed in the third treating liquid L3 from a vertical posture to a horizontal posture. The posture changing member 330 may rotate the storage container C immersed in the third treating liquid L3. The posture changing member 330 may rotate the storage container C immersed in the third treating liquid L3 to convert the posture of the substrates W contained in the storage container C from a vertical posture to a horizontal posture. The posture changing member 330 may include a moving portion 332 and a rotating portion 334.

The moving portion 332 may be installed on the treating bath 310. The moving portion 332 may be configured to be movable along the first direction X. The moving portion 332 may be installed on the side portion of the treating bath 310. For example, the moving portion 332 may have a reversed 'U' shape so that it may be installed over the side portion of the treating bath 310. As described above, the moving portion 332 is configured to be movable in the first direction X, and the storage container C mounted to the rotating portion 334 to be described later may be moved in the first direction X, which is a horizontal direction.

The rotating portion 334 may be installed at the moving portion 332. The rotating portion 334 may be mounted on a mounting groove (not shown) formed at the storage container C. The rotating portion 334 may be mounted on the storage container C to rotate the storage container C. For example, the rotating portion 334 may have a rod shape, and the rotation axis thereof may be parallel to the second direction Y. In addition, the rotating portion 334 may hold the storage container C while the storage container C is immersed in the containing space 312.

The lifting/lowering member 340 may move a substrate W changed to the horizontal posture in an up/down direction. For example, the lifting/lowering member 340 may move the storage container C in the up/down direction. The lifting/lowering member 340 may move the storage container C which has been rotated by the posture changing member 330 in the up/down direction. The lifting/lowering member 340 may be provided attachable and detachable to and from the storage container C. The lifting/lowering member 340 may include a shaft 342 and a driver 344. The shaft 342 may be moved in the up/down direction by a driving force generated by the driver 344. The driver 344 may be a pneumatic or hydraulic cylinder, or a motor. However, the inventive concept is not limited thereto, and the driver 344 may be variously modified as a known device capable of moving the shaft 342 in the up/down direction.

In addition, the shaft 342 may be provided at the bottom portion of the treating bath 310 and adjacent to the first buffer part 210. The shaft 342 may have a rod shape. The shaft 342 may serve as a guide shaft for guiding the position of the storage container C which has been rotated by the posture changing member 330. For example, the shaft 342 may be inserted into the alignment groove CG formed on the bottom portion of the storage container C rotated by the posture changing member 330 to guide the position (e.g., level) of the storage container C. In addition, the lifting/ lowering member 340 mentioned in the above-described example may also be referred to as a guide member or the like.

The wetting module 350 may supply the wetting liquid WL to the substrate W. The wetting liquid WL may be a pure water. The wetting liquid WL may be the same kind of chemical as the third treating liquid L3. The wetting liquid WL may maintain wetness of the substrate W. The wetting module 350 may be installed above an area in which the lifting/lowering member 340 moves the substrate W. The wetting module 350 may be installed on an inner ceiling wall of the third batch-type liquid treating chamber 143 or may be installed on an arm capable of changing the spray position of the wetting module 350.

The wetting module 350 may include a wetting nozzle 352 (an exemplary first wetting nozzle), and a moving member 354. The wetting nozzle 352 may be configured to spray the wetting liquid WL onto the substrate W. The wetting nozzle 352 may be configured to spray the wetting liquid WL in a stream method or a spray method manner. The moving member 354 may be provided to change a position of the wetting nozzle 352. The moving member 354 may be a guide rail installed on an inner ceiling wall of the third batch-type liquid treating chamber 143 or an arm for changing a position of the wetting nozzle 352. The moving member 354 may change the position of the wetting nozzle 352 in the radial direction of the substrate W exposed to the outside away from the third treating liquid L3. The moving member 354 may first spray the wetting liquid WL onto one area (e.g., a center area) of the substrate W, and then move to another area (e.g., ab edge area) which is determined that the wetting state is not maintained to spray the wetting liquid WL. A determination of the wet state may be determined through an image acquisition module (e.g., a camera) that may be installed on the inner ceiling wall of the moving member 354 or the third batch-type liquid treating chamber 143.

Hereinafter, a method of treating a substrate according to an embodiment of the inventive concept will be described with reference to FIG. 7 to FIG. 13. In order to perform the substrate treating method described below, the controller 600 may control the substrate treating apparatus 10.

Figure 7:
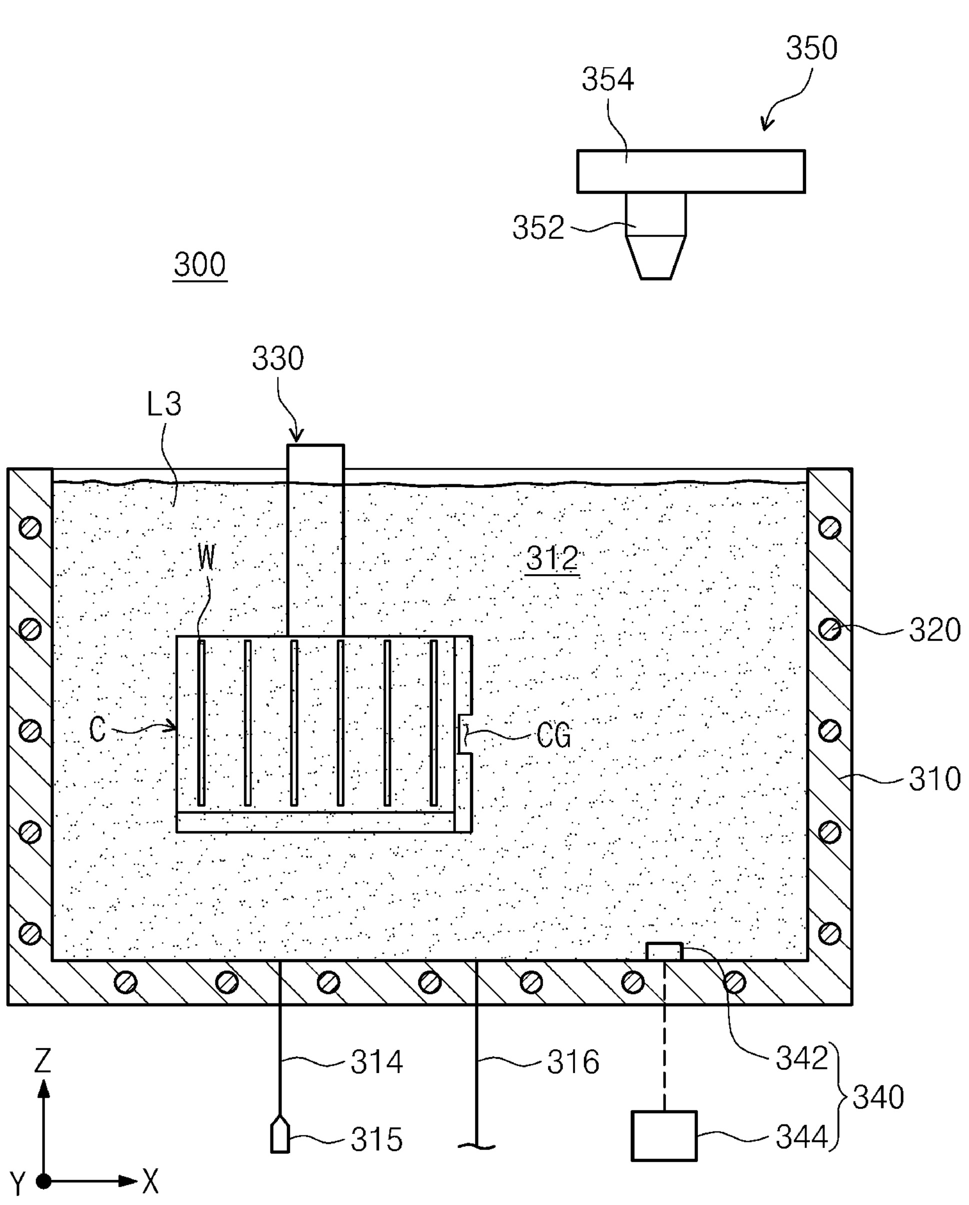
FIG. 7 is a view illustrating a state of treating a substrate in the third batch-type liquid treating chamber of FIG. 6.

Referring to FIG. 7, the storage container C in which a plurality of substrates W, for example, about 25 to 50 substrates W, are stored may be immersed in the third treating liquid L3 supplied to the containing space 312. For example, the storage container C may be immersed in the third treating liquid L3, and the third treating liquid L3 may flow into the storage space of the storage container C to treat the substrates W. In this case, the substrates W stored in the storage container C may maintain a vertical posture. In addition, while the substrates W are treated by the third treating liquid L3, the rotating portion of the posture changing member 330 may grip the storage container C.

Figure 8:
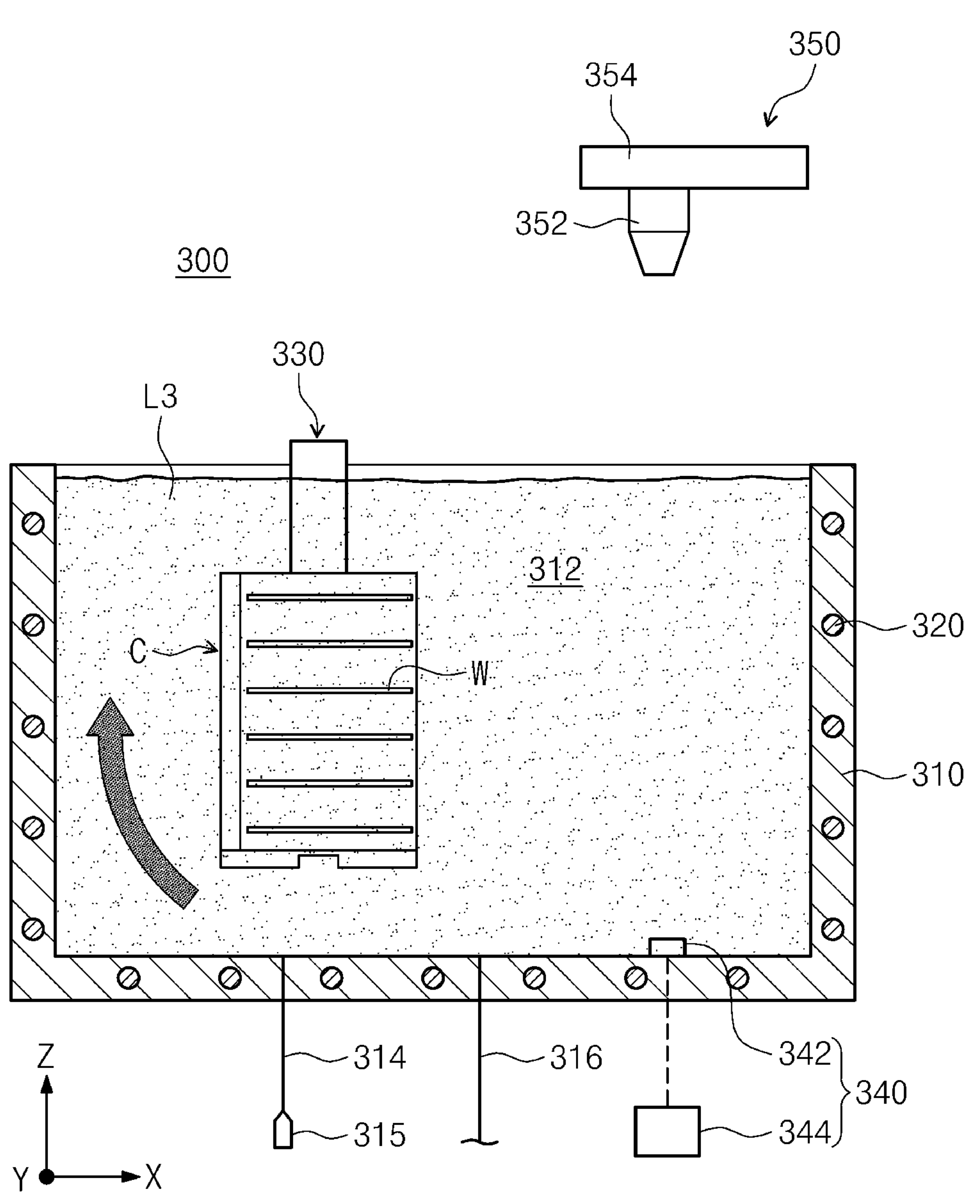
FIG. 8 is a view illustrating a state in which a posture of the substrate is changed in the third batch-type liquid treating chamber of FIG. 6.

Referring to FIG. 8, when the treating of the substrates W is completed by the third treating liquid L3, the rotating portion 334 of the posture changing member 330 may rotate the storage container C. The rotating portion 334 of the posture changing member 330 may rotate the storage container C about a rotation axis thereof parallel to the second direction Y, e.g., rotate the storage container C about 90 degrees. When the storage container C is rotated, the posture of the plurality of substrates W stored in the storage container C may be changed from a vertical posture to a horizontal posture. In this case, the rotating portion 334 may rotate the storage container C while the storage container C is immersed in the third treating liquid L3 supplied to the containing space 312. This is because when the storage container C is rotated while being exposed to the outside (e.g., exposed to the air), the substrates W stored in the storage container C can be dried.

Figure 9:
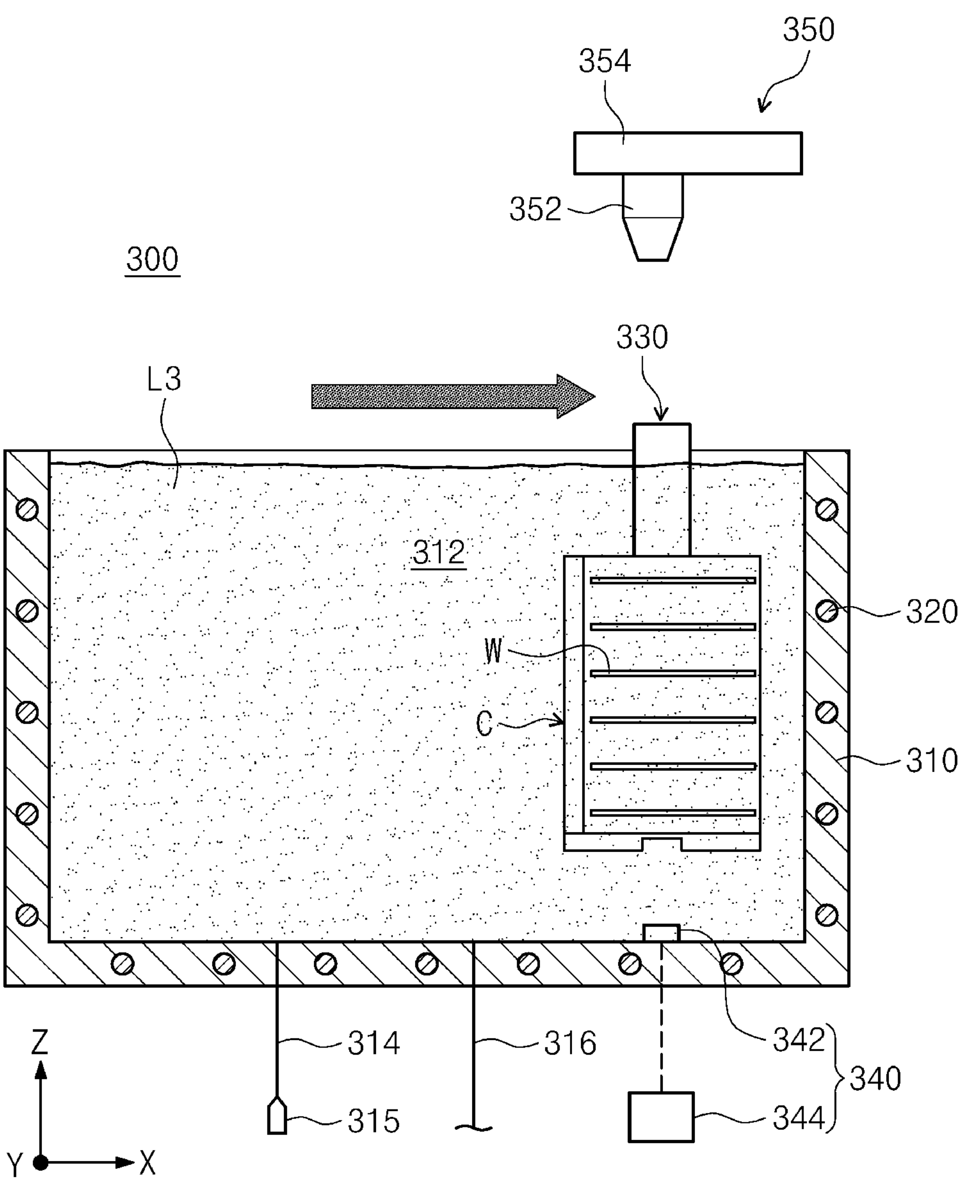
FIG. 9 is a view illustrating a state in which a storage container is moved to a top part of a lifting/lowering member in the third batch-type liquid treating chamber of FIG. 6.

Referring to FIG. 9, the storage container C rotated by the rotating portion 334 may be moved along the first direction X while being mounted on the rotating portion 334. For example, the storage container C may be moved to above the lifting/lowering member 340. In addition, the movement of the storage container C in the horizontal direction may be performed in a state of being immersed in the third treating liquid L3 supplied to the containing space 312. This is because when the storage container C is moved while being exposed to the outside (e.g., exposed to the air), the substrates W stored in the storage container C can be dried.

Figure 10:
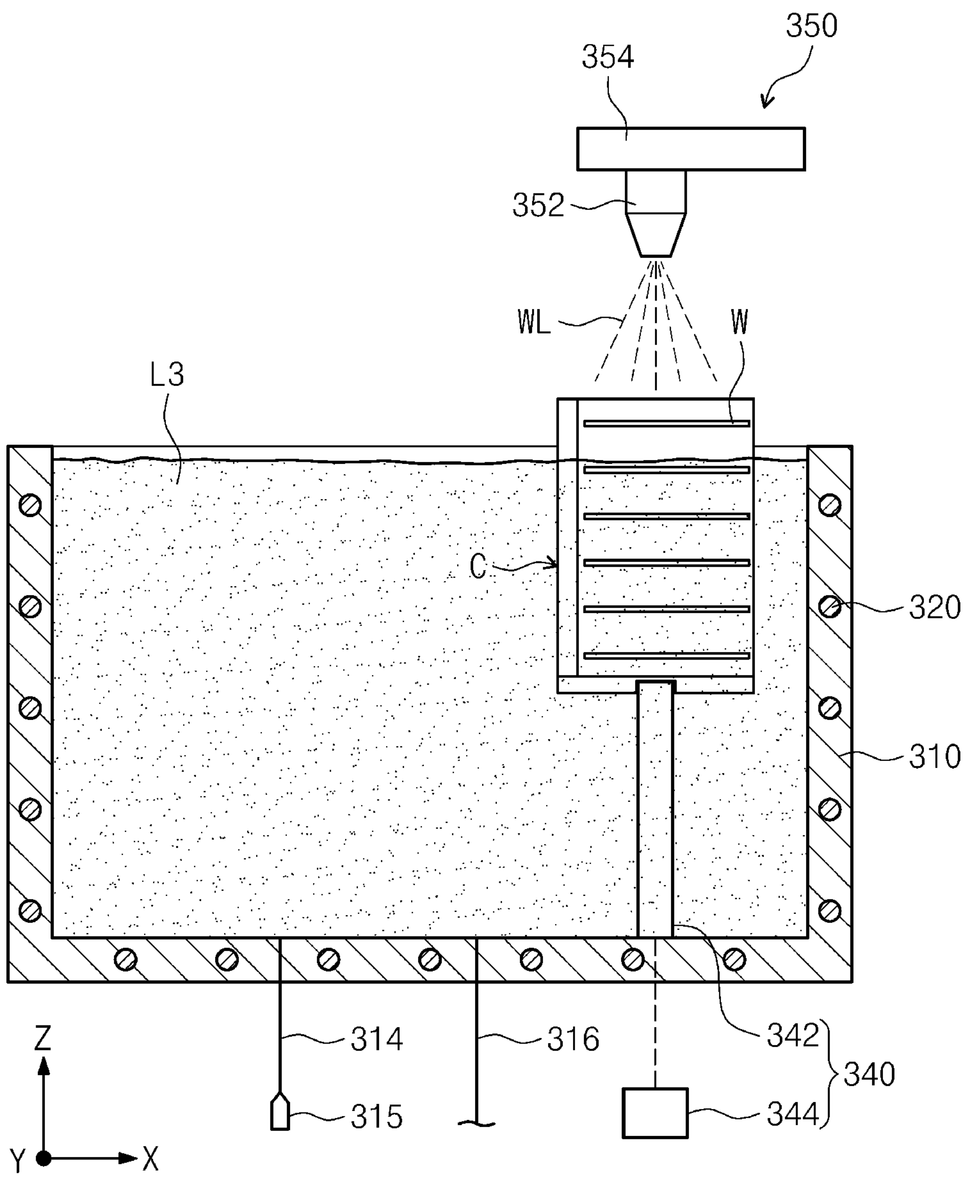
FIG. 10 is a view showing a state in which the substrate disposed at a topmost end of the substrates stored in the storage container is exposed to an air in the third batch-type liquid treating chamber of FIG. 6 and a wetting liquid is sprayed to an exposed substrate.

Referring to FIG. 10, the shaft 342 of the lifting/lowering member 340 may be moved upward and inserted into an alignment groove CG formed in the storage container C. When inserted into the alignment groove CG, the rotating portion 334 may be moved along the second direction Y to be separated from the storage container C. Thereafter, the shaft 342 may move the storage container C upward to expose some of the substrates W contained in the storage container C to the outside (e.g., expose to the air). For example, the shaft 342 may move the storage container C upward to expose only a topmost substrate among the substrates W stored in the storage container C to the outside (e.g., expose the substrate W to the air). This is to prevent the remaining substrates W from being dried, that is, to maintain wettability, except for the topmost substrate among the substrates W taken out from the storage container C by the third transfer unit 152. In addition, even in the case of the topmost substrate W, the wetting module 350 may supply the wetting liquid W to the topmost substrate W to maintain its wetness. In addition, in order to transfer the wetting liquid WL supplied by the wetting module 350, the storage container C may have an open top surface in a state of being rotated by the posture change member 330. The wetting liquid WL may be the same type of liquid as the third treating liquid L3. For example, the wetting liquid WL and the third treating liquid L3 may be chemicals containing a water. For example, the wetting liquid WL and the third treating liquid L3 may be the rinsing liquid described above.

Figure 11:
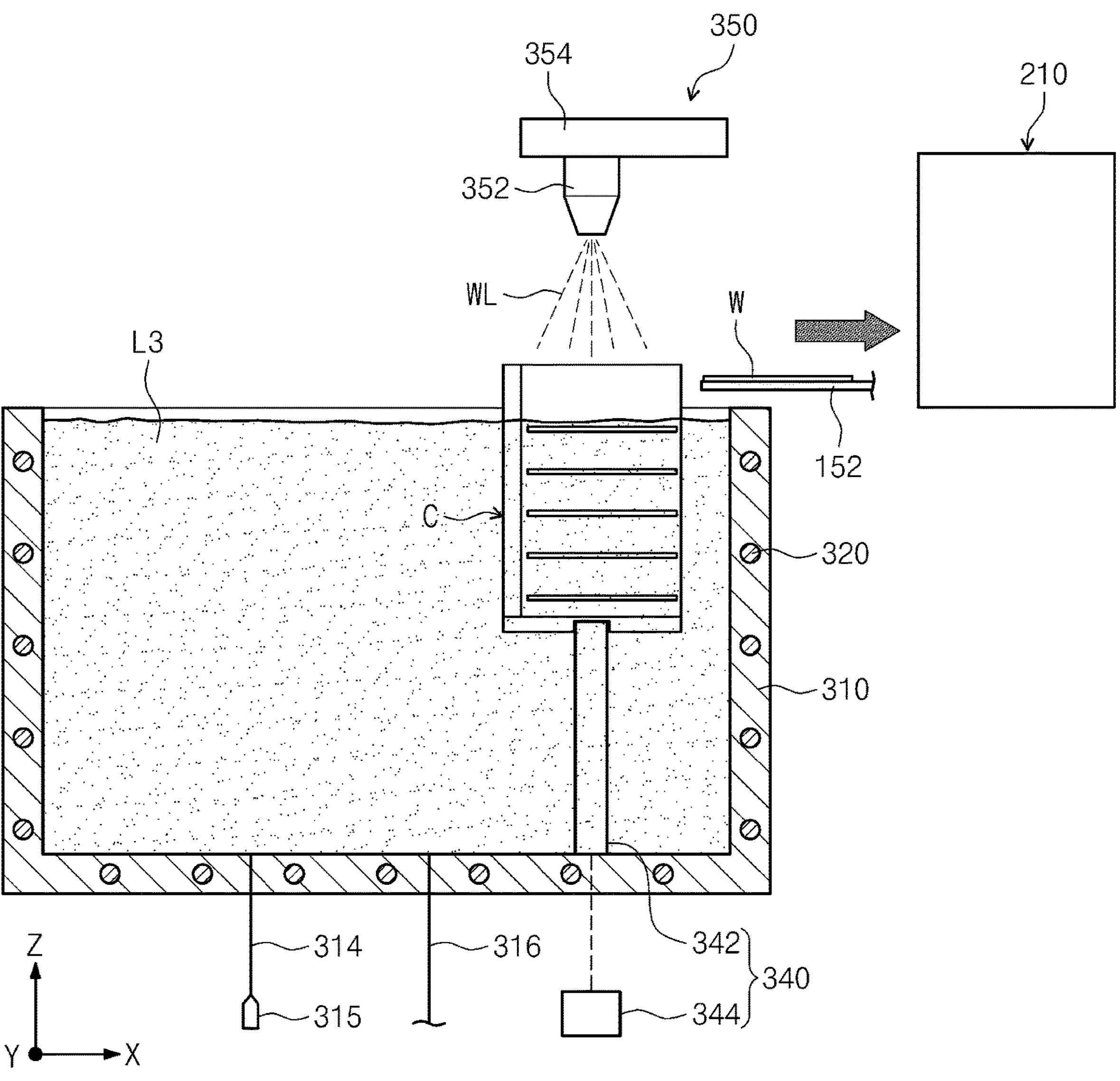
FIG. 11 is a view illustrating a state in which the substrate is taken out of the third batch-type liquid treating chamber of FIG. 6 and brought into a first buffer part.

Referring to FIG. 11, the topmost substrate W among the substrates contained in the storage container C may be carried out from the storage container C by the second transfer unit 152 and returned to the first buffer part 210.

Figure 12:
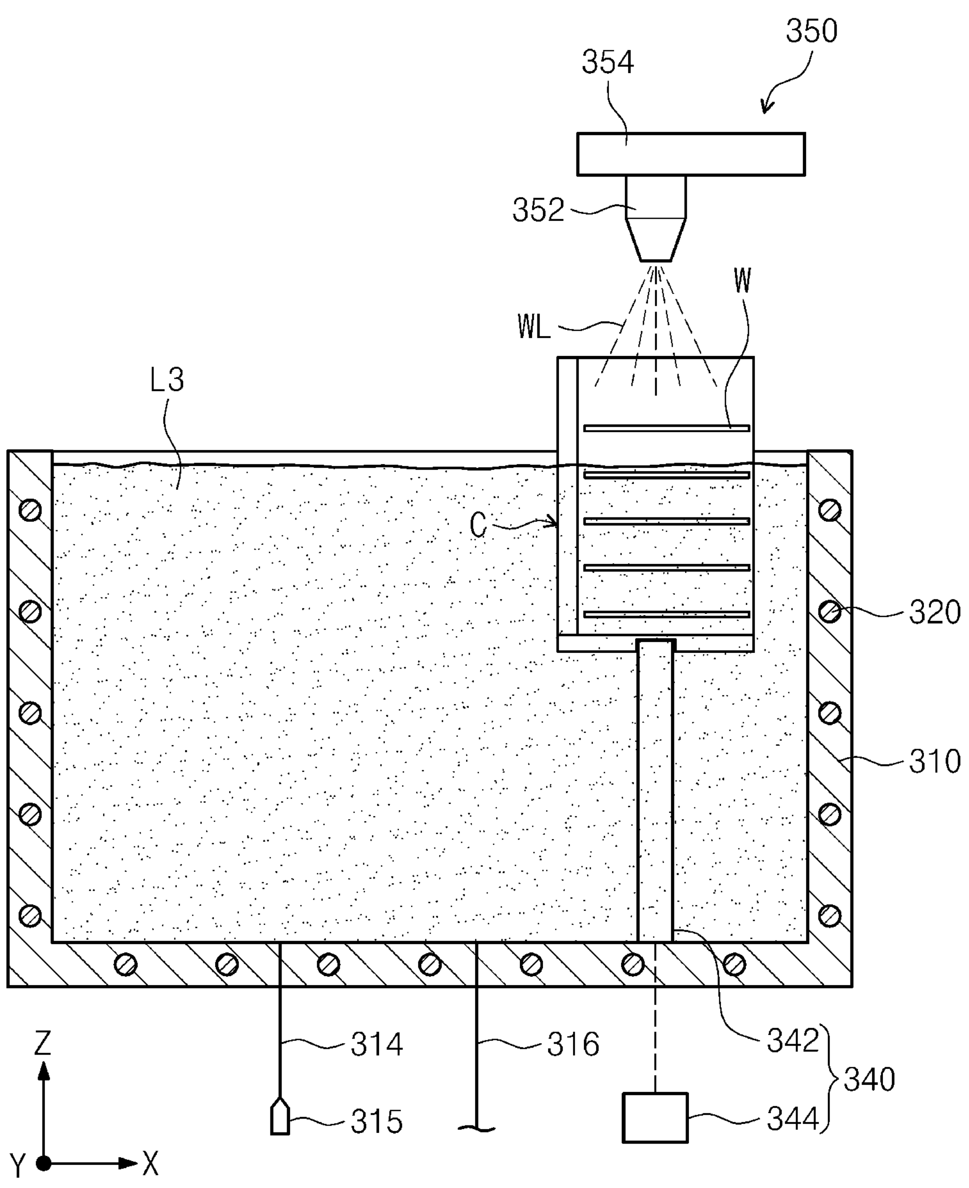
FIG. 12 is a view illustrating a state in which the substrate disposed at the topmost end of the substrates stored in the storage container is exposed to the air and the wetting liquid is sprayed to the exposed substrate after the substrate is taken out from the third batch-type liquid treating chamber of FIG. 4.

Referring to FIG. 12, after the topmost substrate W disposed has been taken out to the storage container C as described above, the shaft 342 of the lifting/lowering member 340 may move the storage container C in an upward direction once again. Accordingly, another topmost substrate W among the substrates W contained in the storage container C may be exposed to the outside (e.g., exposed to the air). This is to prevent the remaining substrates W from being dried, that is, to maintain wettability, except for another topmost substrate W taken out from the storage container C by the third transfer unit 152. In this case too, the wetting module 350 may supply the wetting liquid WL to the topmost substrate.

Figure 13:
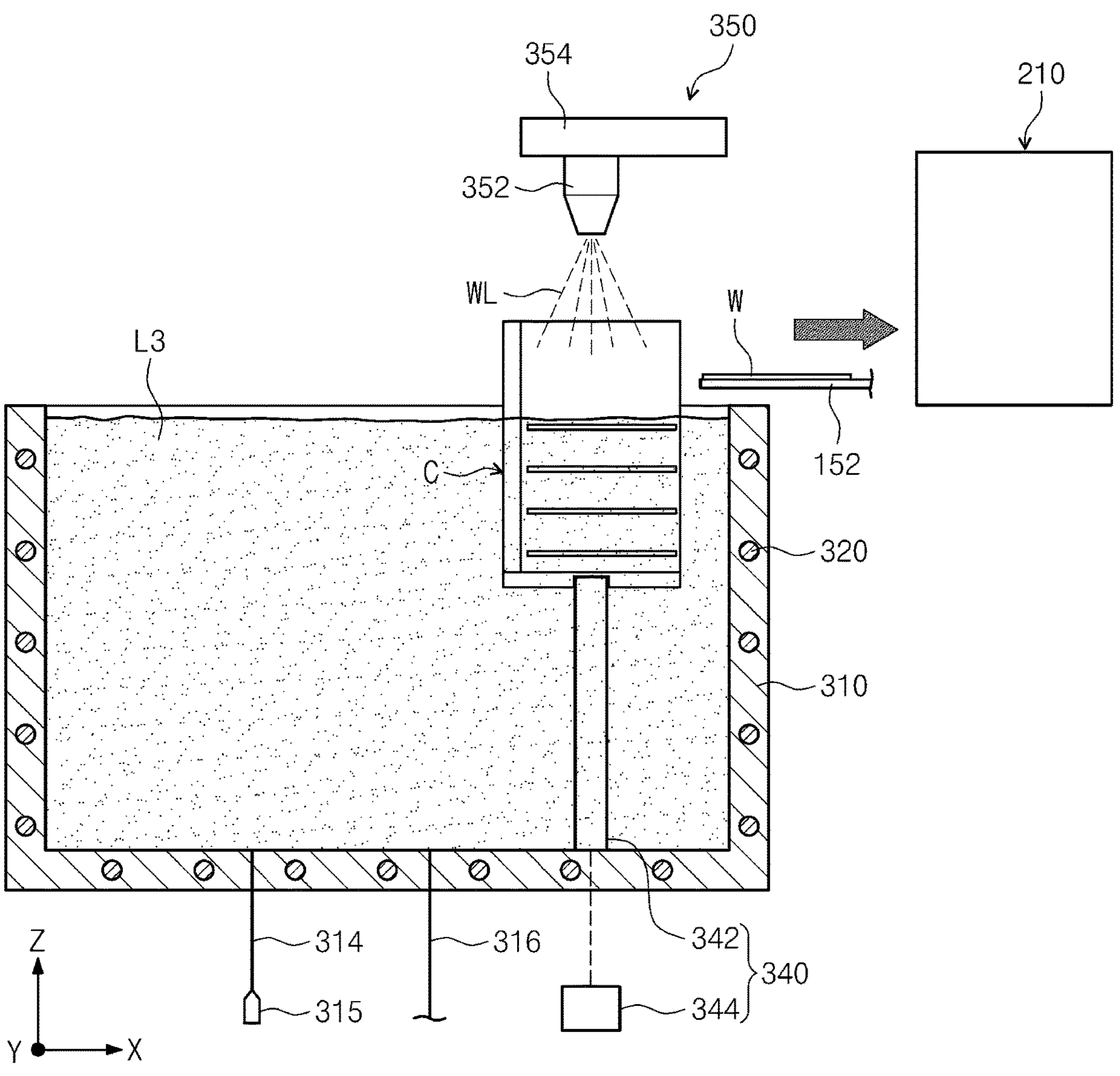
FIG. 13 is a view illustrating a state in which the substrate is taken out of the third batch-type liquid treating chamber of FIG. 6 and brought into the first buffer part.

Referring to FIG. 13, another topmost substrate W among the substrates W contained in the storage container C may be carried out from the storage container C by the second transfer unit 152 and returned to the first buffer part 210.

Referring to FIG. 13, a topmost substrate W of the storage container C may be taken out from the storage container C by the second transfer unit 152 and transferred to a first buffer part 210.

In the above-described example, when a position of a substrate W converted from a vertical posture to a horizontal posture is changed to deviate from a third treating liquid L3 accommodated in a treating bath 310 by a lifting/lowering member 340, a wetting module 350 spraying a wetting liquid WL from a top of the treating bath 310 is described as an example, but is not limited thereto.

Figure 14:
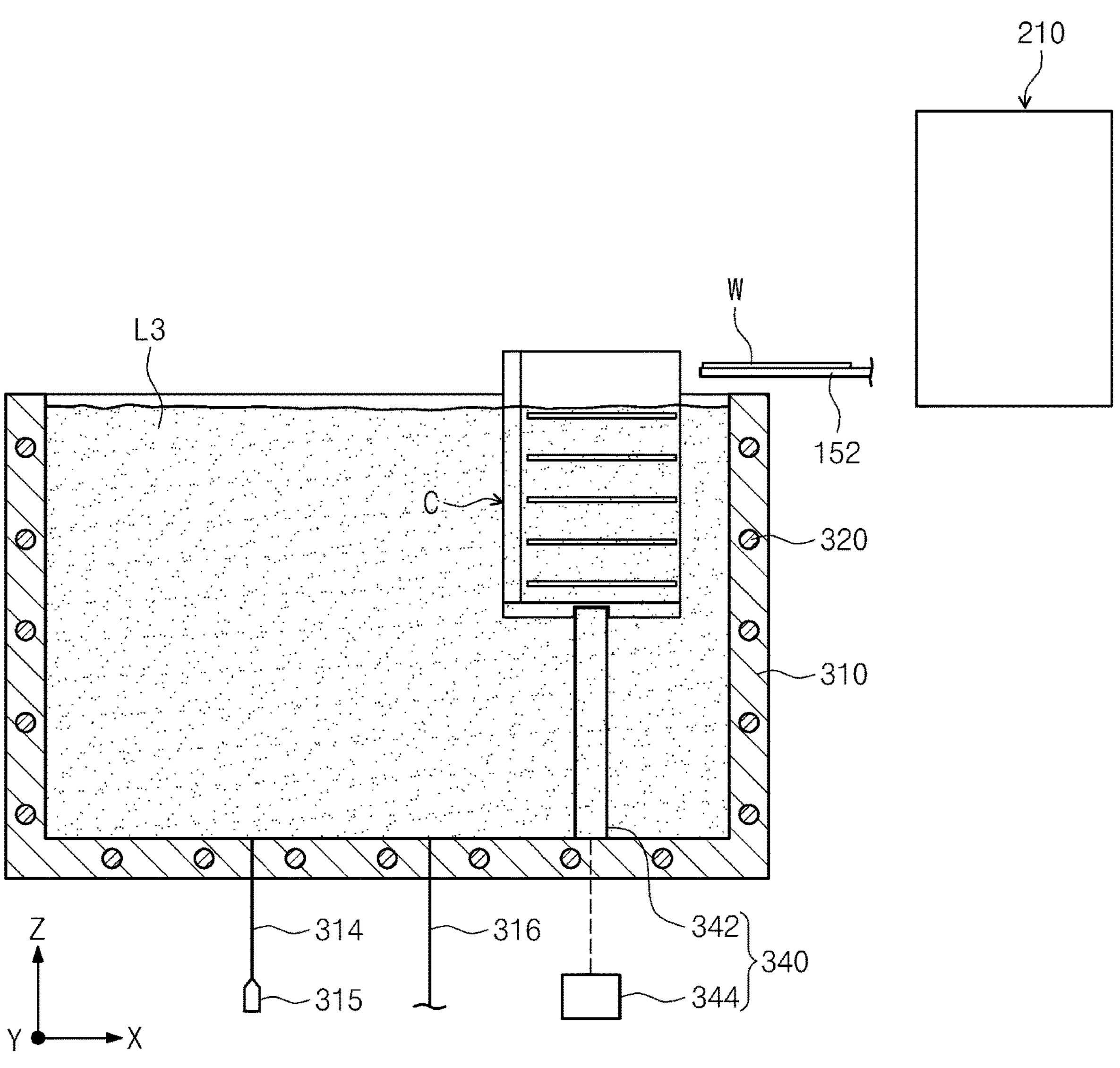
FIG. 14 and FIG. 15 are views illustrating an embodiment of the wetting liquid sprayed to the substrate.
Figure 15:
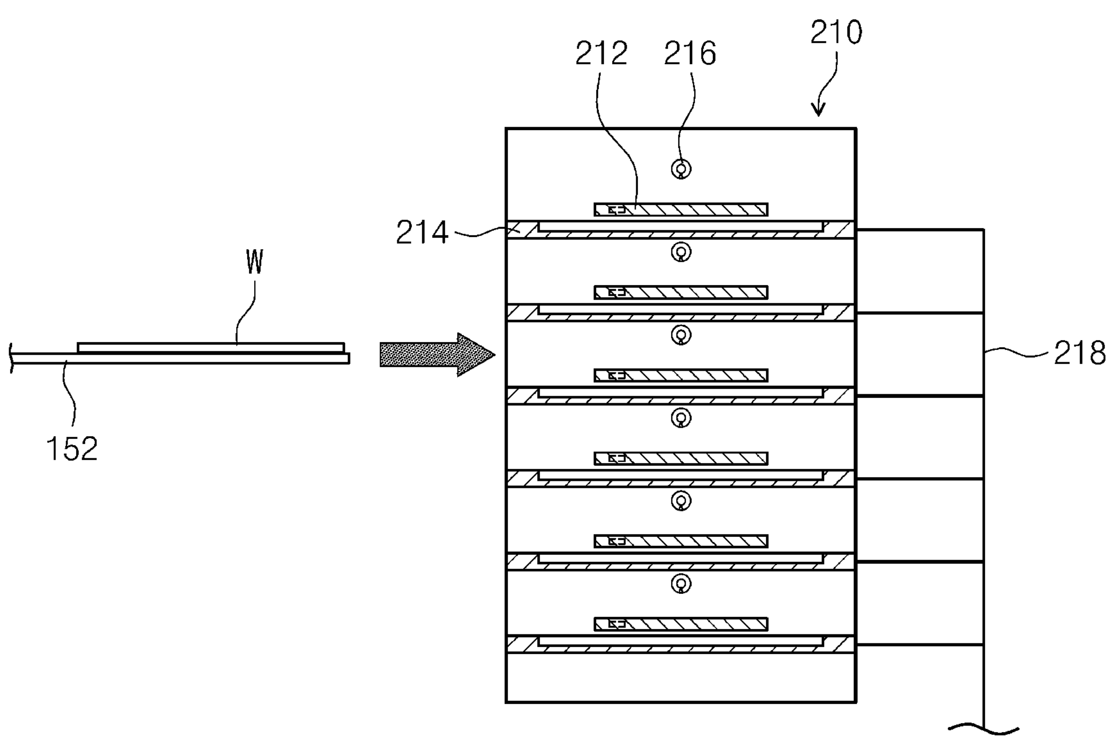
Figure 16:
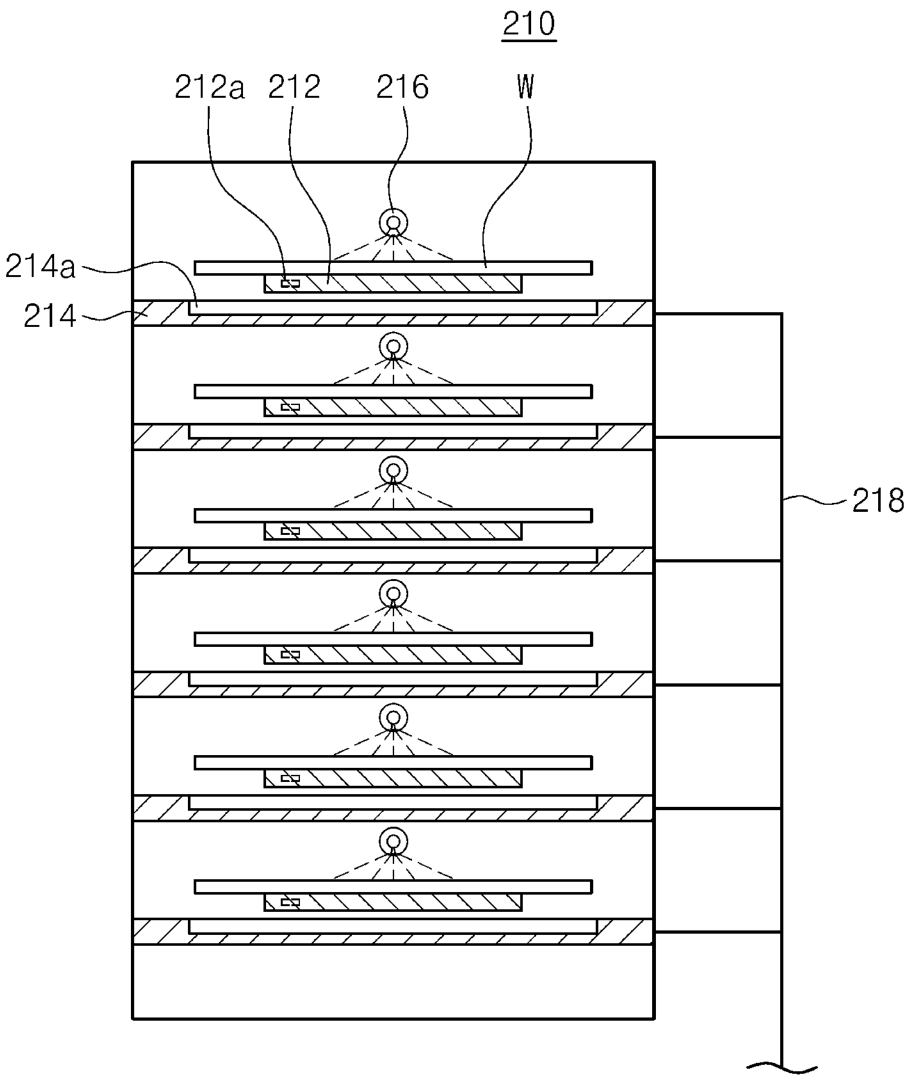
FIG. 16 is a view of the first buffer part maintaining a wetness of the substrate if the substrate is introduced to the first buffer part of FIG. 15.

For example, as shown in FIG. 14 to FIG. 16, the wetting module 350 may not be installed, and the wetting liquid WL may be sprayed from the first buffer part 210.

As shown in FIG. 14 to FIG. 16, the first buffer part 210 may have a structure for supplying the wetting liquid WL to the storage space to prevent substrates W introduced into the storage space from being dried (to maintain a wetness of the substrate W). In addition, the substrates W stored at the first buffer part 210 may be stored in respective storage spaces divided in the first buffer part 210.

The first buffer part 210 may include a support shelf 212, a drain partition 214, a wetting nozzle 216, an example of a second wetting nozzle, and a drain line 218.

A plurality of support shelves 212, a plurality of drain partitions 214, and a plurality of wetting nozzles 216 may be provided to correspond to each substrate W taken into the first buffer part 210. The support shelf 212 may support the substrate W in a space provided by the first buffer part 210. In addition, a weight sensor (not shown) may be installed on the support shelf 212. The weight sensor senses a weight of the substrate W supported by the support shelf 212 to check what the amount of the wetting liquid WL supplied onto the substrate W is.

A controller 600 may adjust the amount of the wetting liquid WL per unit time sprayed from the wetting nozzle 216 based on the weight of the substrate W supported by the support shelf 212. The support shelf 212 may be provided to support a bottom surface of one side or another side of the substrate W.

The wetting nozzle 216 may be configured to spray the wetting liquid WL in a stream method or a spray method. A plurality of wetting nozzles 216 may be provided, and one of the wetting nozzles 216 and another other of the wetting nozzles 216 may be disposed to face each other. That is, a pair of wetting nozzles 216 may spray the wetting liquid WL onto the substrate W. A wetting nozzle 216 may include a chemical or a nozzle supplying a mist capable of maintaining a wetness of the substrate W taken back to the storage space of the first buffer part 210. The chemical or the mist may supply a wetting liquid WL selected from an isopropyl alcohol (IPA), the chemical described above, and a rinsing liquid described above.

The drain partition 214 may be disposed below the support shelf 212. The drain partition 214 may be disposed under each of the substrates W supported on the support shelf 212. The drain partition 214 serves as a liquid receiver for receiving a wetting liquid WL sprayed by the wetting nozzle 216 and may partition a space in which each substrate W is disposed. The drain partition 214 has a rectangular container shape with an open top so as to have a liquid receiving space, and the liquid receiving space of the drain partition 214 may be connected to a drain line 218. Accordingly, the wetting liquid WL sprayed by the wetting nozzle 216 may be discharged to an outside.

In addition, in the above example, the wetting module 350 supplied the wetting liquid WL onto the substrate W or the first buffer part 210 supplied the wetting liquid WL, but the substrate treating apparatus 10 may be configured such that the wetting module 350 supplies the wetting liquid WL and the first buffer part 210 also supplies the wetting liquid WL.

Figure 17:
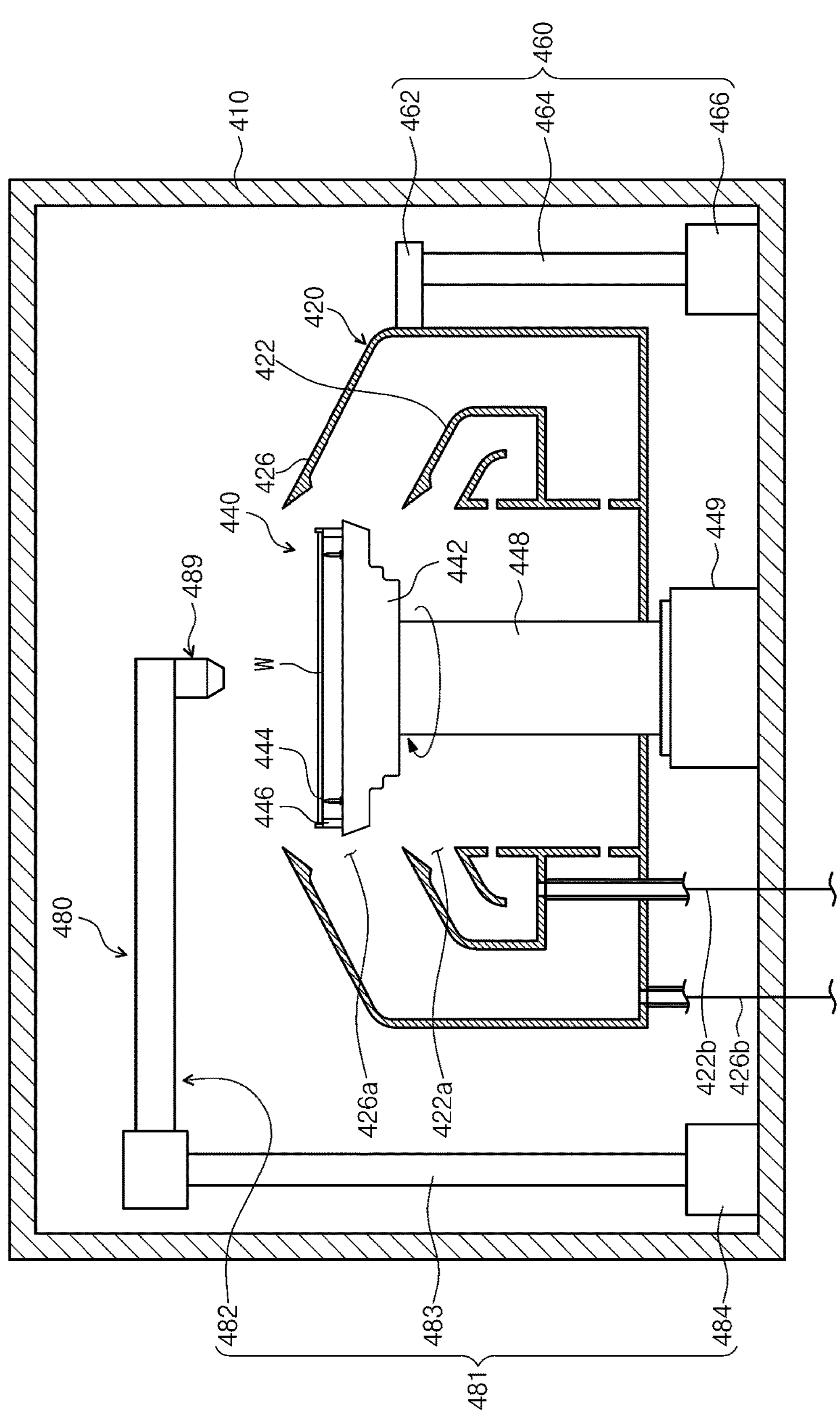
FIG. 17 is a view of the substrate treating apparatus provided in a single-type liquid treating chamber of FIG. 1.

FIG. 17 is a view illustrating a substrate treating apparatus provided in the single-type liquid treating chamber of FIG. 1. The substrate treating apparatus 400 provided in the single-type liquid treating chamber 230 may include a housing 410, a treating container 420, a support unit 440, a lifting/lowering unit 460, and a liquid supply unit 480.

The housing 410 has a treating space 412 therein. The housing 410 may have a cylindrical shape having a space therein. A treating container 420, a support unit 440, a lifting/lowering unit 460, and a liquid supply unit 480 may be provided in the treating space 412 of the housing 410. The housing 410 may have a rectangular shape when viewed from a front cross section. However, the inventive concept is not limited thereto, and the housing 410 may be transformed into various shapes capable of having a treating space 412.

The treating container 420 has a cylindrical shape with an open top. The treating container 420 has an inner recollecting container 422 and an outer recollecting container 426. Each of the recollecting containers 422 and 426 recovers different treating liquids among the treating liquids used in the process. The inner recollecting container 422 is provided in an annular ring shape surrounding the substrate support unit 440, and the outer recollecting container 426 is provided in an annular ring shape surrounding the inner recollecting container 426. The inner space **422*a* of the inner recollecting container 422 and the inner recollecting container 422 function as a first inlet 422*a* through which a treating liquid flows into the internal recollecting container 422. The space 426*a* between the inner recollecting container 422 and the external recollecting container 426 functions as a second inlet 426*a* through which a treating liquid flows into the outer recollecting container 426. According to an embodiment, each of the inlets 422*a* and 426*a* may be positioned at different heights. Recollecting lines 422*b* and 426*b* are connected under the bottom surfaces of each of the recollecting containers 422 and 426. The treating liquids introduced into each of the recollecting containers 422 and 426 can be provided and reused to an external treating liquid regeneration system (not illustrated) through the recollecting lines 422*b* and 426*b***.

The support unit 440 supports the substrate Win the treating space 412. The support unit 440 supports and rotates the substrate W during the process. The support unit 440 has a support plate 442, a support pin 444, a chuck pin 446, and rotation driving members 448 and 449.

The support plate 442 is provided in a substantially circular plate shape and has a top surface and a bottom surface. The bottom surface has a smaller diameter than the top surface. That is, the support plate 442 may have a wide top surface and a narrow bottom surface shape. The top surface and the bottom surface are positioned such that their central axes coincide with each other. In addition, a heating means (not shown) may be provided on the support plate 442. The heating means provided to the support plate 442 may heat the substrate W placed on the support plate 442. The heating means can generate heat. The heat generated by the heating means may be a heating temperature or a cooling temperature. The heat generated by the heating means may be transferred to the substrate W placed on the support plate 442. In addition, the heat transferred to the substrate W may heat the treating liquid supplied to the substrate W. The heating means may be a heater and/or a cooling coil.

However, the inventive concept is not limited thereto, and the heating means may be variously modified into known devices.

A plurality of support pins 444 are provided. The support pins 444 are disposed at an edge of the top surface of the support plate 442, spaced apart from each other by a predetermined interval, and upwardly protrude from the support plate 442. The support pins 444 are disposed to have an annular ring shape as a whole by combination with each other. The support pins 444 support an edge of the bottom surface of the substrate W so that the substrate W is spaced apart from the top surface of the support plate 442 by a predetermined distance.

A plurality of chuck pins 446 are provided. The chuck pins 446 are disposed farther from the center of the support plate 442 than the support pins 444. The chuck pins 446 are provided to upwardly protrude from the top surface of the support plate 442. The chuck pins 446 support the side portion of the substrate W so that the substrate W is not laterally separated from a predetermined position when the support plate 442 is rotated. The chuck pins 446 are provided to be able to move linearly between the outer position and the inner position along the radial direction of the support plate 442. The outer position is a position away from the center of the support plate 442 compared to the inner position. When the substrate W loads or unloads on the support plate 442, the chuck pins 446 are located at an outer position, and when a process is performed on the substrate W, the chuck pins 446 are located at an inner position. The inner position is a position where the chuck pins 446 and the side portion of the substrate W are in contact with each other, and the outer position is a position where the chuck pins 446 and the substrate W are spaced apart from each other.

The rotation driving members 448 and 449 rotate the support plate 442. The support plate 442 may be rotated around a magnetic central axis by the rotation driving members 448 and 449. The rotation driving members 448 and 449 include a support shaft 448 and a driving part 449. The support shaft 448 has a cylindrical shape facing a fourth direction 16. The top end of the support shaft 448 is fixedly coupled to the bottom surface of the support plate 442. According to an embodiment, the support shaft 448 may be fixedly coupled to the center of the bottom surface of the support plate 442. The driving unit 449 provides a driving force to rotate the support shaft 448. The support shaft 448 is rotated by the driving part 449, and the support plate 442 is rotatable together with the support shaft 448.

The lifting/lowering unit 460 linearly moves the treating container 420 in the up/down direction. As the treating container 420 is moved up and down, the relative height of the treating container 420 with respect to the support plate 442 is changed. When the substrate W is loaded or unloaded on the support plate 442, the treating container 420 is lowered by the lifting/lowering unit such that the support plate 442 protrudes upward from the treating container 420. In addition, when the processing proceeds, the height of the treating container 420 is adjusted so that the treating liquid may flow into preset recollecting containers 422 and 426 according to the type of treating liquid supplied to the substrate W. The lifting/lowering unit 460 has a bracket 462, a moving shaft 464, and a driver 466. The bracket 462 is fixedly installed on the outer wall of the treating container 420, and a moving shaft 464 moving in the up/down direction by the driver 466 is fixedly coupled to the bracket 462. Selectively, the lifting/lowering 460 may move the support plate 442 in an up/down direction.

The liquid supply unit 480 may supply a treating liquid to the substrate W. The treating liquid may be an organic solvent, or the rinse liquid or the chemical described above. The organic solvent may be isopropyl alcohol (IPA) liquid.

The liquid supply unit 480 may include a moving member 481 and a nozzle 489. The moving member 481 moves the nozzle 489 to a process position and a standby position. The process position is a position at which the nozzle 489 faces the substrate W supported by the support unit 440. According to an embodiment, the process position is a position at which the treating liquid is discharged from the top surface of the substrate W. In addition, the process position includes a first supply position and a second supply position. The first supply position may be a position closer to the center of the substrate W than the second supply position, and the second supply position may be a position including an end of the substrate. Optionally, the second supply position may be an area adjacent to the end of the substrate. The standby position is defined as a position where the nozzle 489 deviates from the process position. According to an embodiment, the standby position may be a position at which the nozzle 489 stands by before or after the processing is completed on the substrate W.

The moving member 481 includes an arm 482, a support shaft 484, and a driver 484. The support shaft 484 is located on one side of the treating container 420. The support shaft 484 has a rod shape with its longitudinal direction facing the fourth direction. The support shaft 484 is provided to be rotatable by the driver 484. The support shaft 484 is provided to be upwardly and downwardly movable. The arm 482 is coupled to the top end of the support shaft 484. The arm 482 extends vertically from the support shaft 484. A nozzle 489 is coupled to the end of the arm 482. As the support shaft 484 is rotated, the nozzle 489 may swing together with the arm 482. The nozzle 489 may swing and be moved to a process position and a standby position. Optionally, the arm 482 may be provided to be able to move forwardly and backwardly in its longitudinal direction. When viewed from above, a path through which the nozzle 489 moves may coincide with a central axis of the substrate W at a process position.

Figure 18:
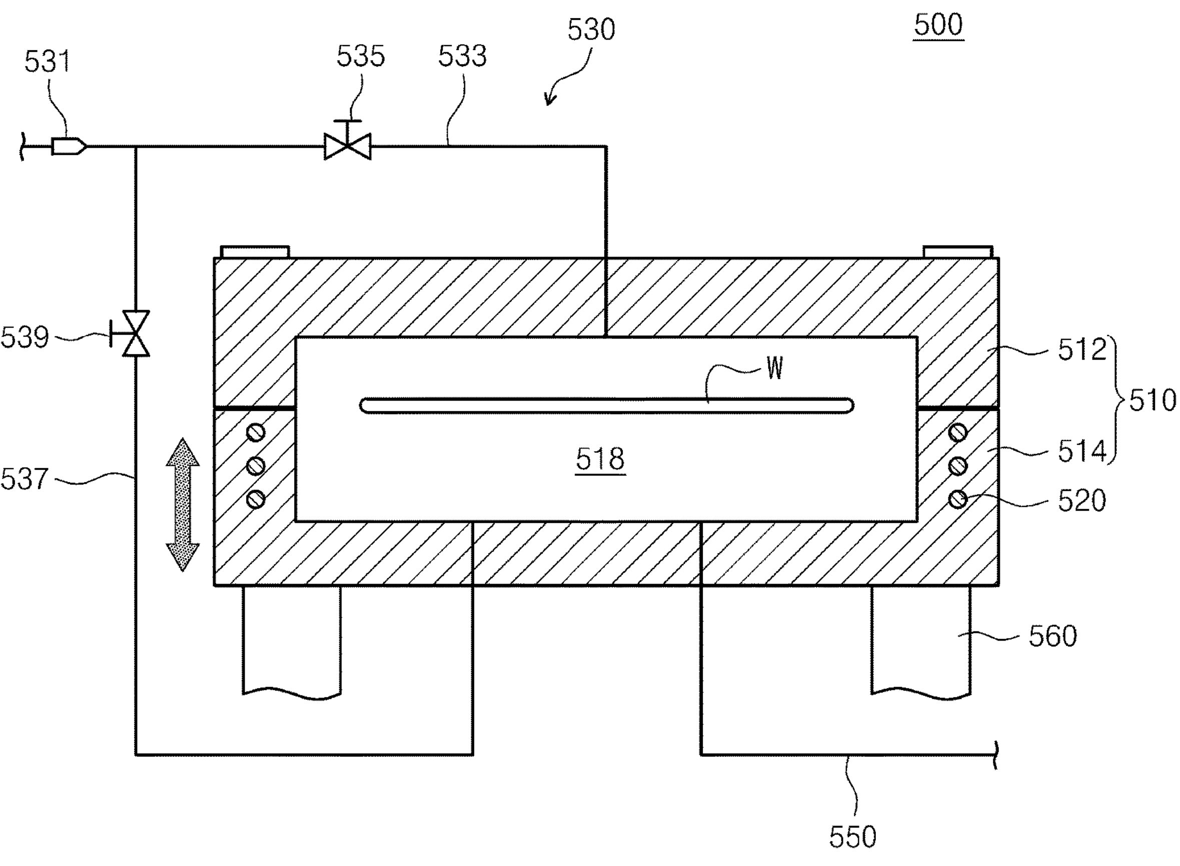
FIG. 18 is a view illustrating the substrate treating apparatus provided in a drying chamber of FIG. 1.

FIG. 18 is a view illustrating a substrate treating apparatus provided in the drying chamber of FIG. 1. Referring to FIG. 18, the drying chamber 500 may remove the treating liquid remaining on the substrate W by using the drying fluid G in a supercritical state. The drying chamber 500 may be a supercritical chamber for removing the treating liquid (e.g., a rinse liquid or an organic solvent) remaining on the substrate W using a supercritical fluid. For example, the drying chamber 500 may perform a drying treatment process of removing the organic solvent remaining on the substrate W using carbon dioxide ($CO_2$) in a supercritical state.

The drying chamber 500 may include a body 510, a heating member 520, a fluid supply unit 530, a fluid exhaust unit 550, and a lifting/lowering member 560. The body 510 may have an inner space 518 in which the substrate W is treated. The body 510 may provide an inner space 518 in which the substrate W is treated. The body 510 may provide an inner space 518 in which the substrate W is dried by the drying fluid G in a supercritical state.

The body 510 may include a top body 512 and a bottom body 514. The top body 512 and the bottom body 514 may be combined with each other to form the inner space 518. The substrate W may be supported in the inner space 518. For example, the substrate W may be supported by a support member (not shown) in the inner space 518. The support member may be configured to support the bottom surface of the edge region of the substrate W. Any one of the top body 512 and the bottom body 514 may be coupled to the lifting/lowering member 560 to be moved in the up/down direction. For example, the bottom body 514 may be coupled to the lifting/lowering member 560 to be moved in the up/town direction by the lifting/lowering member 560. Accordingly, the inner space 518 of the body 510 may be selectively sealed. In the above-described example, the bottom body 514 is coupled to the lifting/lowering member 560 to move in the up/down direction, but the inventive concept is not limited to it. For example, the top body 512 may be coupled to the lifting/lowering member 560 to move in the up/down direction.

The heating member 520 may heat the drying fluid G supplied to the inner space 518. The heating member 520 may phase-change the drying fluid G supplied to the inner space 518 into a supercritical state by raising the temperature of the inner space 518 of the body 510. In addition, the heating member 520 may raise the temperature of the inner space 518 of the body 510 to maintain the supercritical state of the drying fluid G supplied to the inner space 518.

In addition, the heating member 520 may be buried in the body 510. For example, the heating member 520 may be buried in any one of the top body 512 and the bottom body 514. For example, the heating member 520 may be provided in the bottom body 514. However, the inventive concept is not limited thereto, and the heating member 520 may be provided at various positions capable of raising the temperature of the inner space 518. In addition, the heating member 520 may be a heater. However, the inventive concept is not limited thereto, and the heating member 520 may be variously modified into a known device capable of raising the temperature of the inner space 518.

The fluid supply unit 530 may supply the drying fluid G to the inner space 518 of the body 510. The drying fluid G supplied by the fluid supply unit 530 may include a carbon dioxide ($CO_2$). The fluid supply unit 530 may include a fluid supply source 531, a first supply line 533, a first supply valve 535, a second supply line 537, and a second supply valve 539.

The fluid supply source 531 may store and/or supply the drying fluid G supplied to the inner space 518 of the body 510. The fluid supply source 531 may supply the drying fluid G to the first supply line 533 and/or the second supply line 537. For example, a first supply valve 535 may be installed on the first supply line 533. In addition, a second supply valve 539 may be installed on the second supply line 537. The first supply valve 535 and the second supply valve 539 may be on/off valves. According to an on/off state of the first supply valve 535 and the second supply valve 539, the drying fluid G may selectively flow through the first supply line 533 or the second supply line 537.

In the above-described example, the first supply line 533 and the second supply line 537 are connected to one fluid supply source 531, but the inventive concept is not limited thereto. For example, a plurality of fluid supply sources 531 may be provided, the first supply line 533 may be connected to any one from a plurality of fluid supply sources 531, and the second supply line 537 may be connected to another one of the fluid supply sources 531.

In addition, the first supply line 533 may be a top supply line that supplies drying gas from a top portion of the inner space 518 of the body 510. For example, the first supply line 533 may supply a drying gas to the inner space 518 of the body 510 in a direction from top to bottom. For example, the first supply line 533 may be connected to the top body 512. In addition, the second supply line 537 may be a bottom supply line that supplies drying gas from a bottom portion of the inner space 518 of the body 510. For example, the second supply line 537 may supply drying gas to the inner space 518 of the body 510 in a downward-to-upward direction. For example, the second supply line 537 may be connected to the bottom body 514.

The fluid exhaust unit 550 may exhaust the drying fluid G from the inner space 518 of the body 510.

Figure 19:
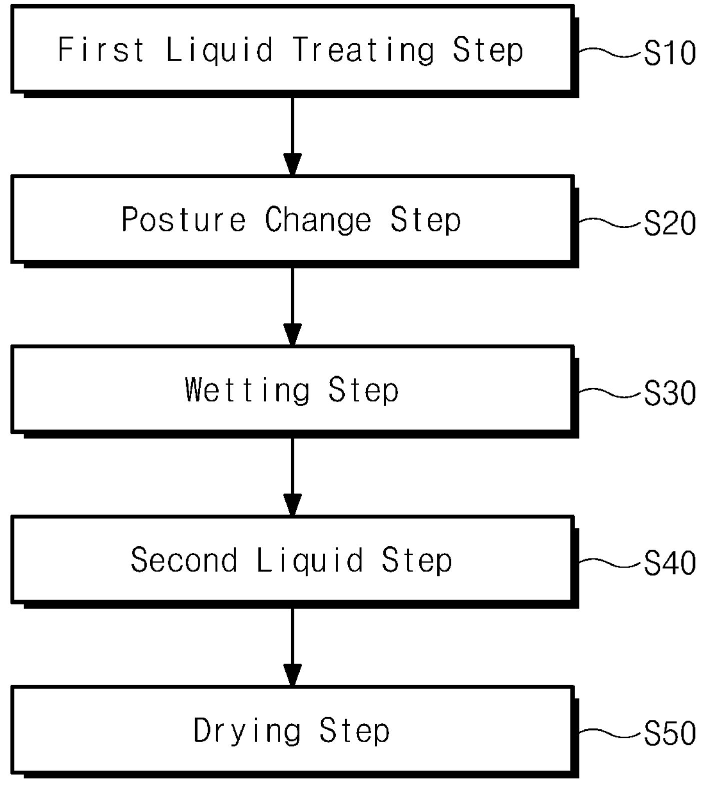
FIG. 19 is a flowchart illustrating the substrate treating method according to an embodiment of the inventive concept.

FIG. 19 is a flowchart illustrating a substrate treating method according to an embodiment of the inventive concept. The substrate treating method according to an embodiment of the inventive concept may be performed by a substrate treating apparatus 10 described above.

The substrate treatment method according to an embodiment of the inventive concept may include a first liquid treating step S10, a posture change step S20, a wetting step S30, a second liquid treating step S40, and a drying step S50. The first liquid treating step S10, the posture change step S20, the wetting step S30, the second liquid treating step S40, and the drying step S50 can be carried out sequentially.

The first liquid treating step S10 may be a step of simultaneously treating a plurality of substrates W in a batch-type method. The first liquid treating step S10 may be performed in a batch-type liquid treating chamber 140. In the first liquid treating step S10, the substrate W in the vertical posture may be liquid-treated in a batch manner. The first liquid treating step S10 may be performed a plurality of times. For example, the first liquid treating step S10 may be performed multiple times in the treating bath 310 of each first batch-type liquid treating chamber 141, second batch-type liquid treating chamber 142, and third batch-type liquid treating chamber 143. As described above, the types of treating liquids used in each first batch-type liquid treating chamber 141, second batch-type liquid treating chamber 142, and third batch-type liquid treating chamber 143 may be different from each other.

The last first liquid treating step S10 among the first liquid treating steps S10 may be performed in the third batch-type liquid treating chamber 143.

In the posture change step S20, the posture of the substrate W rinse-treated in the treating bath 310 of the third batch-type liquid treating chamber 143 may be changed. The posture change step S20 may be performed while the substrate W is immersed in the third treating liquid L3 accommodated in the treating bath 310. In the posture change step S20, the posture of the substrate W may be changed from a vertical posture to a horizontal posture. The posture change step S20 may be performed by the posture change member 330 described above. In addition, in the posture change step S20, the position of the substrate W may be changed to deviate from the third treating liquid L3. For example, the substrate W whose posture is changed in the horizontal posture by the posture change member 330 may be changed in an upward direction by the lifting/lowering member 340 to be exposed away from the third treating liquid L3 accommodated in the treating bath 310.

In the wetting step S30, the wetting liquid WL may be sprayed onto the substrate W exposed to the outside away from the third treating liquid L3 to prevent a natural drying of the substrate W. The wetting liquid WL may be the same type of liquid as the third treating liquid L3 described above. In addition, the wetting liquid WL may be a type of liquid different from the first treating liquid L1 and the second treating liquid L2 described above.

Also, the wetting step S30 may be performed by the wetting module 350. For example, the wetting step S30 may be performed by a wetting module 350 that sprays the wetting liquid WL onto the substrate W from the top part of the treating bath 310.

Also, the wetting step S30 may be performed by the first buffer part 210. For example, in the wetting step S30, when the substrate W is introduced onto the first buffer part 210, the wetting nozzle 216 of the first buffer part 210 may spray the wetting liquid WL onto the substrate W.

As the wetting step S30 is performed, it is possible to minimize the natural drying of the substrate W before being introduced into the single-type treating chamber.

In the second liquid treating step S40, the substrate W may be liquid-treated in a single-type method. The second liquid treating step S40 may be performed in the liquid treating chamber 230 when the substrate W is introduced into the first buffer part 210 from the batch-type liquid treating chamber 140 and the substrate W temporarily stored in the first buffer part 210 is returned to the liquid treating chamber 230. In the second liquid treating step S40, an organic solvent such as IPA may be supplied onto the substrate W. The organic solvent supplied onto the substrate W may be substituted with the third treating liquid L3 or the wetting liquid WL remaining on the substrate W.

In the drying step S50, the substrate W may be dried in a single-type method. The drying step S50 can be performed at the drying chamber 240 when the liquid-treated substrate W in the second liquid treating step S40 is transferred to the drying chamber 240. In the drying step S50, a supercritical treatment fluid (e.g., supercritical carbon dioxide) may be supplied onto the substrate W to remove an organic solvent, a wetting liquid WL, or a third treating liquid L3.

In some cases, the drying step S50 may not be performed in the drying chamber 240, but the substrate W may be dried by rotating the substrate W in the single-type liquid treating chamber 230 at a high speed.

As described above, the substrate treating apparatus 10 according to an embodiment of the inventive concept may include both the batch-type liquid treating chamber 140 and the single-type liquid treating chamber 230. Accordingly, it is possible to have all the advantages of the batch-type liquid treatment method and the single-type liquid treating method.

For example, in the batch-type liquid treating chamber 140, a plurality of substrates W may be treated at once, and thus throughput of the treating of the substrate W is excellent, and processing uniformity between the substrates W is very high. In addition, when the pattern formed on the substrate W has a high aspect ratio, it is possible to supplement the batch-type liquid treating chamber 140 (e.g., the portion that has not yet been etched) by supplying a chemical, a rinse liquid, and the like from the single-type liquid treating chamber 230. In addition, the substrate W wetted by organic solvent supplied by the single-type liquid treating chamber 230 or the first buffer part 210 may be transferred to the drying chamber 240 for drying the substrate W by supplying a supercritical fluid. The supercritical fluid has an excellent penetration property into a space between the patterns formed on the substrate W, and may dry the substrate W without rotating the substrate W, thereby minimizing the occurrence of the pattern leaning phenomenon described above. In addition, the substrate treating apparatus 10 of the inventive concept may perform all of the single-type liquid treatment method, the batch-type liquid treatment method, and the method of drying the substrate W using a supercritical fluid, thereby improving defects due to particles, and shedding and flowability. In addition, since the number of substrates W treatable in the batch-type liquid treating chamber 140 is relatively large, a large number of liquid treating chambers are not required, so there is an advantage of reducing the footprint of the substrate treating apparatus 10. In addition, by further including the single-type liquid treating chamber 230 as described above, it is possible to solve the problem of abnormal growth of $SiO_2$ in a pattern on the substrate W that may occur when the substrate W is treated using only the batch-type liquid treating chamber 140.

In addition, as in the substrate treating apparatus 10 according to an embodiment of the inventive concept, it is essential to change the posture of the substrate W from a vertical posture to a horizontal posture when both the batch-type liquid treating chamber 140 and the single-type liquid treating chamber 230 are provided. Accordingly, the substrate treating apparatus 10 according to an embodiment of the inventive concept includes a posture changing member 330 to convert the posture of the substrate W from a vertical posture to a horizontal posture. In this case, the wettability of the substrate W may be maintained as much as possible (if not, the substrate W may be dried to generate a water mark), and the posture of the substrate W is changed while the substrate W is immersed in the treating liquid L. In addition, when the substrate W is taken out of the batch-type liquid treating chamber 140 and transferred to the first buffer part 210, the remaining substrates W except for the substrate W to be transferred remain immersed in the treating liquid L, thereby minimizing drying of the substrate W and generating a water mark.

In addition, a plurality of storage containers C are provided in the substrate treating apparatus 10. Some of the plurality of storage containers C may be used to liquid treat the substrate W in the batch-type liquid treating chamber 140, and others may be used to store the substrate W in a first index chamber 120 and to change a posture of the substrate W.

Figure 20:
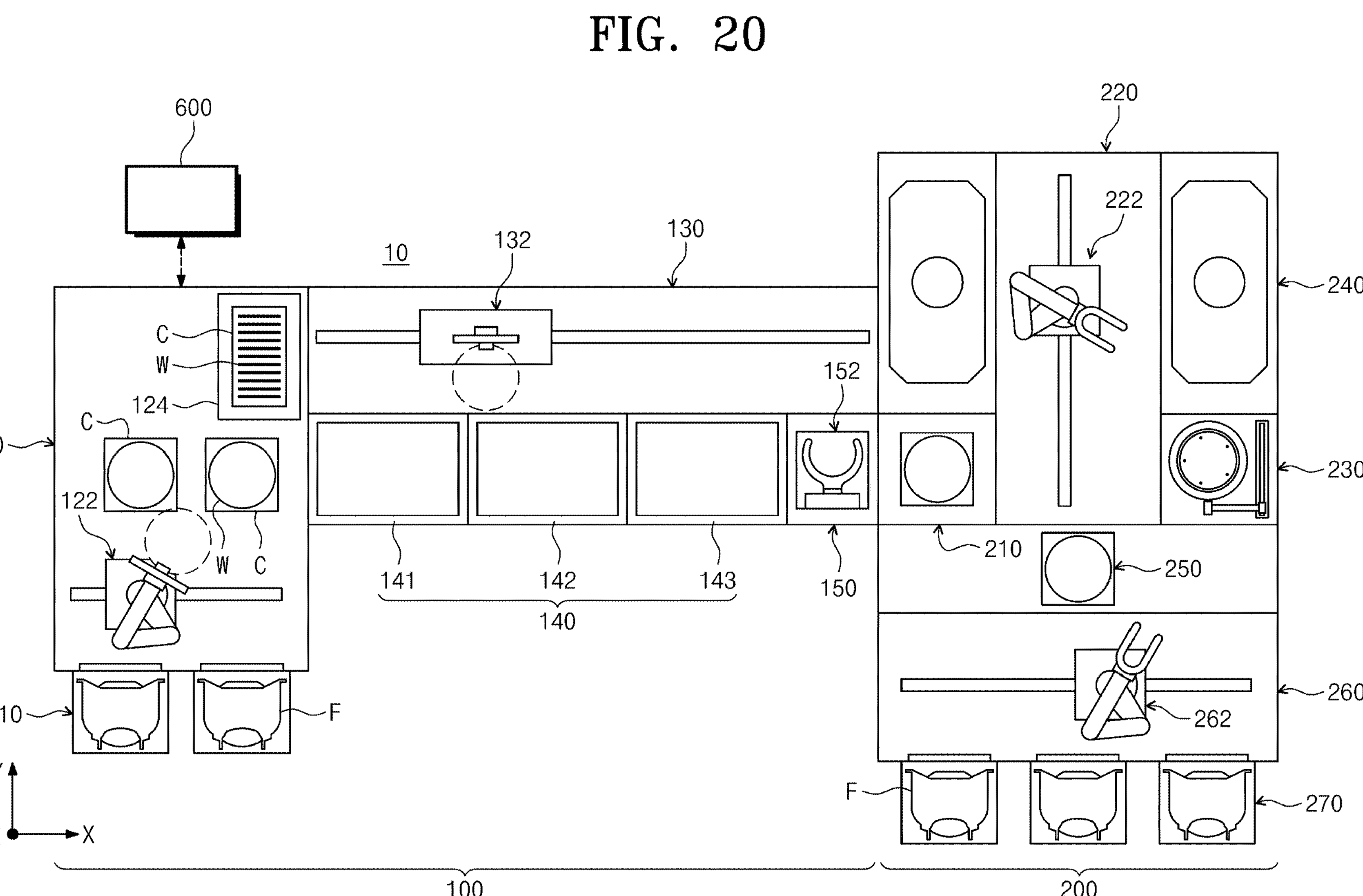
FIG. 20 is a schematic view of the substrate treating apparatus according to an embodiment of the inventive concept viewed from above.

In the above-described example, when the substrate W is transferred between the batch-type liquid treating chambers 140 of the first treating part 100, the storage container C is transferred by the first transfer unit 132, but the inventive concept is not limited thereto. For example, as illustrated in FIG. 20, the first transfer unit 132 may have a batch-hand for transferring a plurality of substrates W (e.g., 25 wafers) at once, and the first transfer unit 132 may transfer only a plurality of substrates W instead of the storage container C between the batch-type liquid treating chambers 140. In addition, if the first transfer unit 132 has a batch-hand, a storage container C may be disposed in each of the batch-type liquid treating chambers 140, or a support member supporting a plurality of substrates W may be provided. In addition, although the first transfer robot 122 transports the substrate W one by one in the above-described example, the first transfer robot 122 may also have a batch-type hand for transferring a plurality of substrates W at once.

Figure 21:
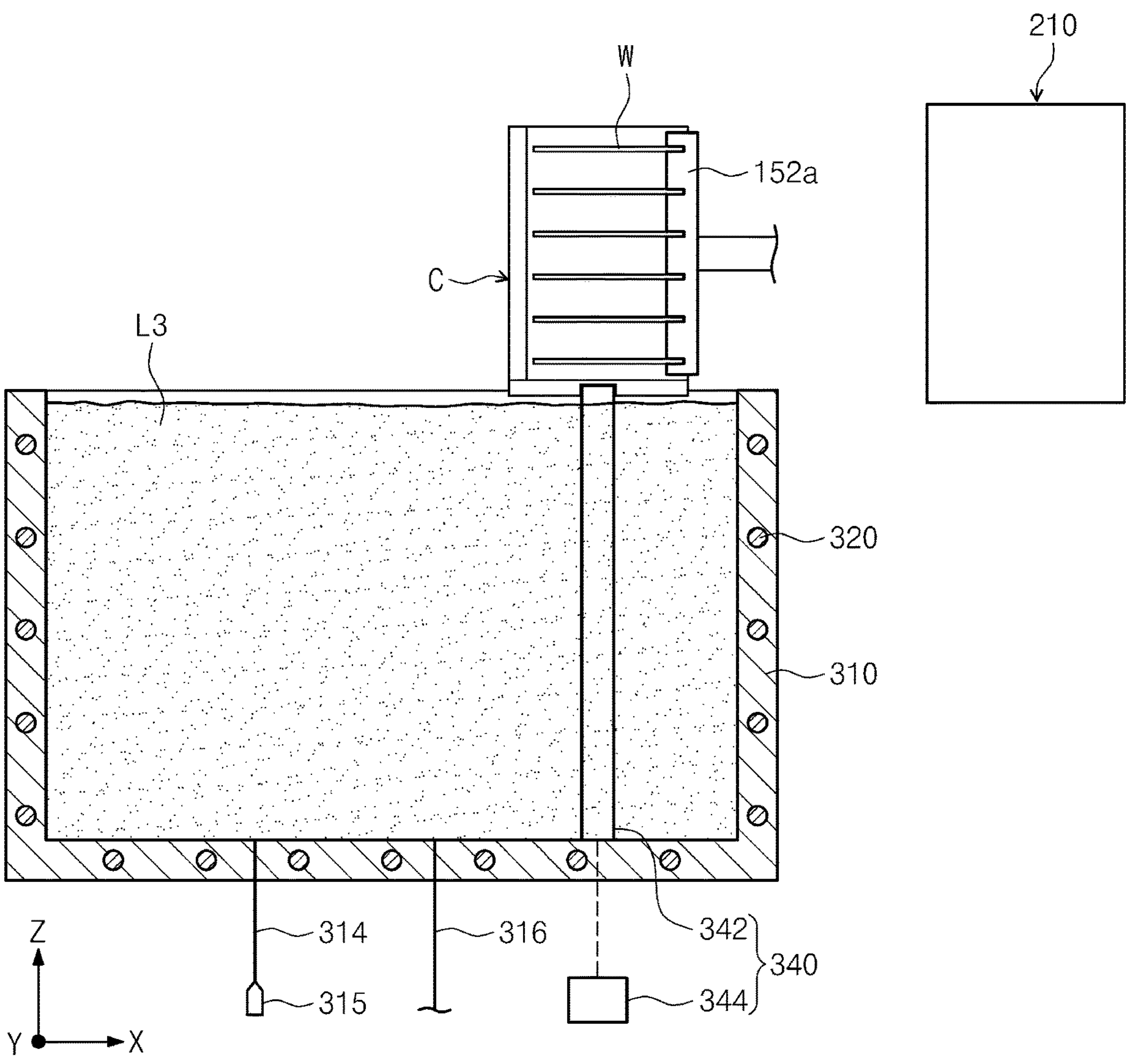
FIG. 21 and FIG. 22 illustrate a state in which a second transfer unit transfers the substrate according to an embodiment of the inventive concept.
Figure 22:
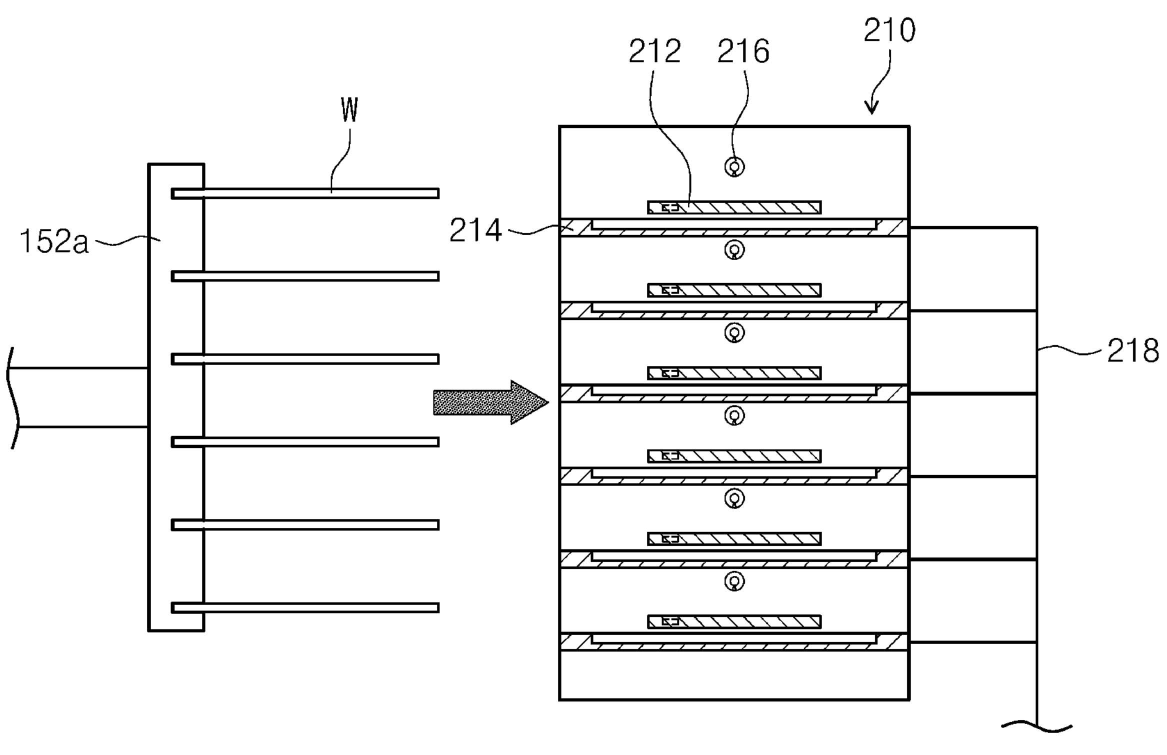

In the above-described example, although the second transfer unit 152 has a single-type hand for taking out the substrate W if the substrate W is taken out from the third batch-type liquid treating chamber 143, the inventive concept is not limited thereto. As illustrated in FIG. 21 and FIG. 22, the second transfer unit 152*a* may have a batch-type hand capable of transferring multiple substrates W at once. In this case, a lifting/lowering member 340 may move the storage container C so that all of the substrates W stored in the storage container C are exposed to the outside away from the third treating liquid L3. When the plurality of substrates W are exposed to the outside, the second transfer unit 152 may take the substrates W out of the storage container C and transfer the substrates W to the first buffer part 210. In this case, a space between the plurality of substrates W gripped by the batch-type hand may be the same as a space between the support shelves 212.

Figure 23:
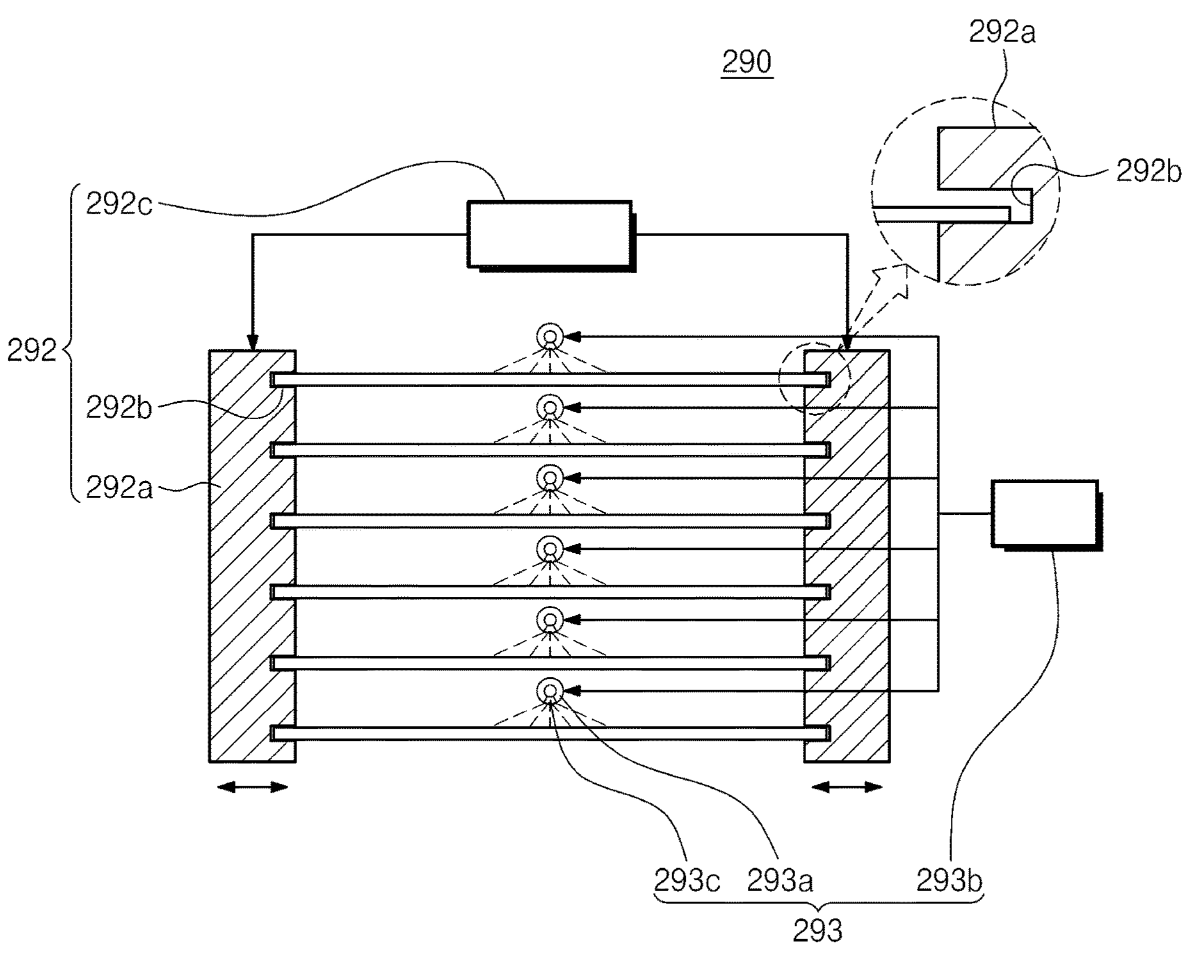
FIG. 23 illustrates the substrate treating apparatus provided in a liquid treating chamber according to an embodiment of the inventive concept.
Figure 24:
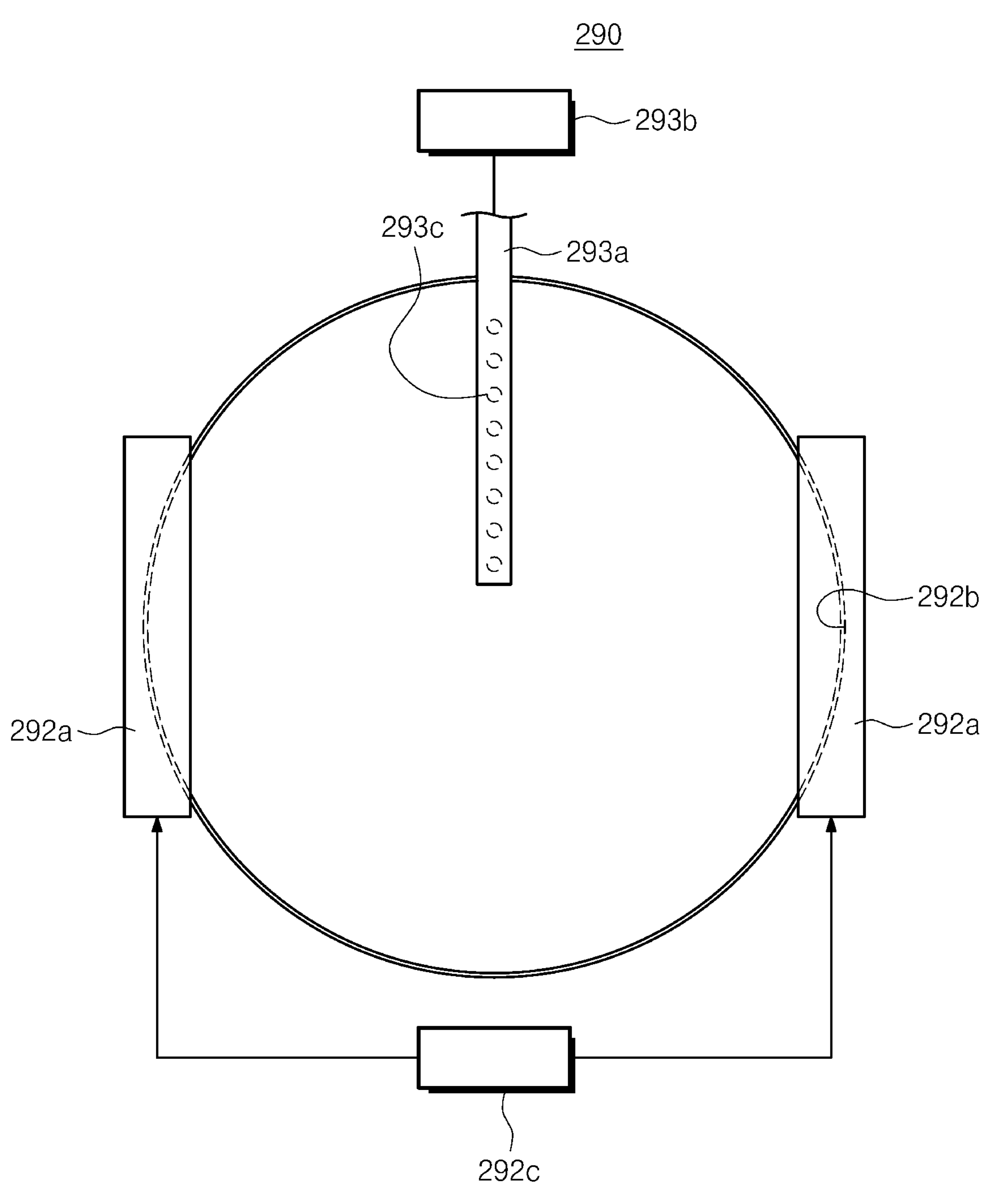
FIG. 24 is a top view of the substrate treating apparatus of FIG. 23.

In the above-described example, it has been described that a second treating part 200 is provided with a single-type liquid treating chamber 230 for treating the substrate W one by one, but the inventive concept is not limited thereto. For example, as illustrated in FIG. 23 and FIG. 24, a liquid treating chamber 290 for simultaneously treating the plurality of substrates W may be provided to the second treating part 200.

The liquid treating chamber 290 may include a support unit 292 and a liquid supply unit 293. The support unit 292 may include a pair of support bodies 292*a* and a driving unit 292*c* in which support grooves 292*b* are formed to support a plurality of substrates W. The driving unit 292*c* may move the support body 292*a* in a lateral direction.

The liquid supply unit 293 may include a nozzle 293*a* and a liquid supply unit 293*b* for supplying a treating liquid to a substrate W supported by the pair of support bodies 292*a*. At least one nozzle hole 293*c* may be formed in the nozzle 293*a*, and the nozzle 293*a* may be moved between a standby position located outside the substrate W and a process position which is a position capable of supplying the treating liquid to a central region of the substrate W when viewed from above.

Figure 25:
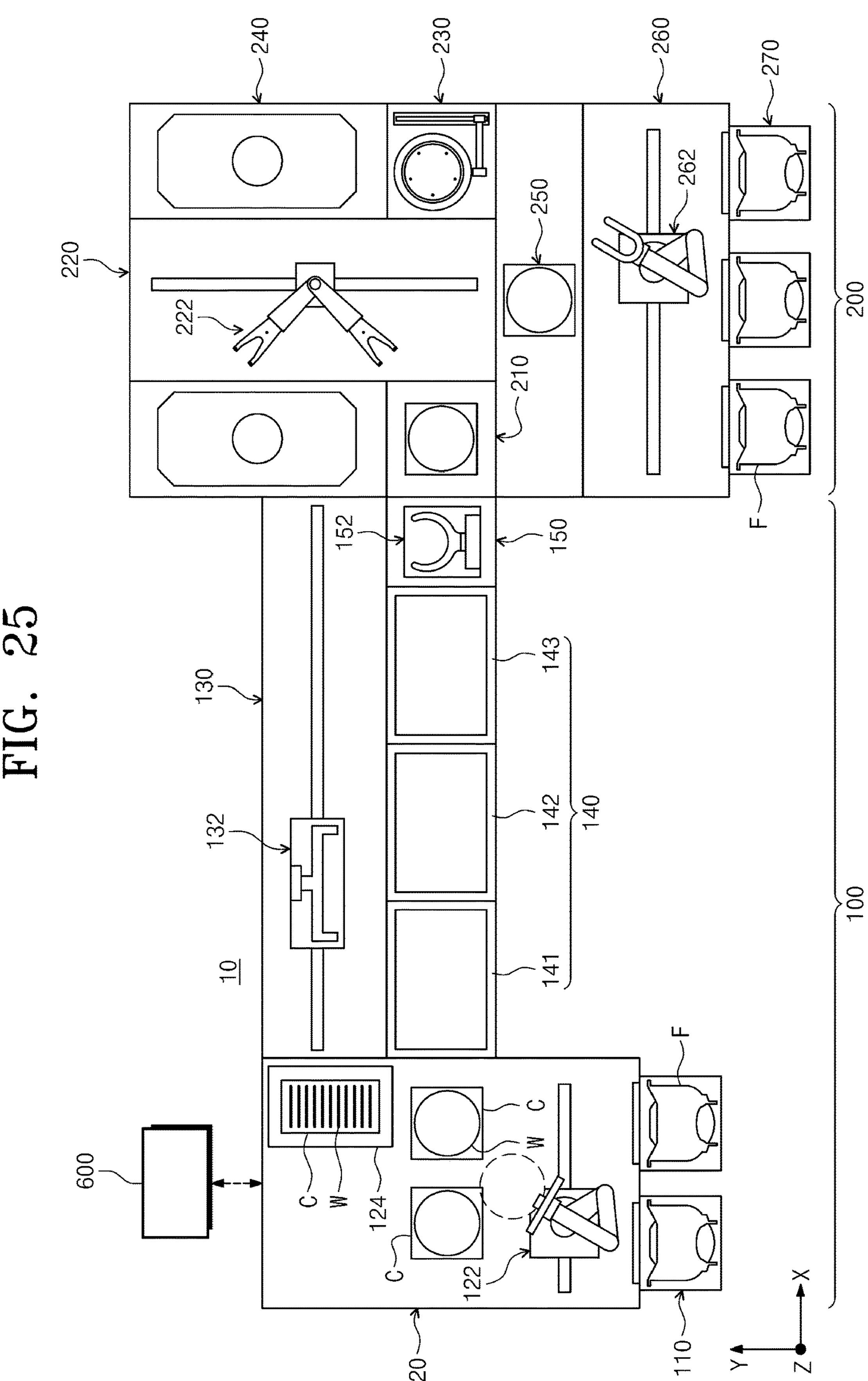
FIG. 25 is a top view of the substrate treating apparatus according to an embodiment of the inventive concept.

In the above-described example, a third transfer unit 222 takes out one substrate W from the first buffer part 210 and transfers the substrate W to the single-type treating chamber, but the inventive concept is not limited thereto. For example, as shown in FIG. 25, the third transfer unit 222 may have a plurality of transfer hands. The third transfer unit 222 may carry out a plurality of substrates W from the first buffer part 210 and simultaneously transfers the substrates W to the single-type treating chamber. In this case, a time required for transferring the substrate W may be minimized.

In the above-described example, the substrate treating apparatus 10 according to an embodiment of the inventive concept includes both a single-type liquid treating chamber 230 and a drying chamber 240, but is not limited thereto. For example, the substrate treating apparatus 10 may include only one of a single-type liquid treating chamber 230 and a drying chamber 240.

In the above-described example, the substrate W taken out of the batch-type liquid treating chamber 140 is transferred to the single-type liquid treating chamber 230, and after the substrate W treatment is completed in the single-type liquid treating chamber 230, the substrate W is transferred to the drying chamber 240, but is not limited thereto. For example, if a particle level is good, the substrate W may be directly transferred to the drying chamber 240 from the batch-type liquid treating chamber 140.

The effects of the inventive concept are not limited to the above-mentioned effects, and the unmentioned effects can be clearly understood by those skilled in the art to which the inventive concept pertains from the specification and the accompanying drawings.

Although the embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a treating bath for liquid treating a plurality of substrates and having an accommodation space for accommodating a treating liquid;

a posture changing member for changing a posture of a substrate which is immersed in the treating liquid from a vertical posture to a horizontal posture;

a wetting module installed above the treating bath for spraying a wetting liquid on a substrate exposed to the outside and separated from the treating liquid; and a transfer unit having a hand for transferring the substrate; and a controller, wherein the posture changing member comprises:

a moving portion installed at a side portion of the treating bath and configured to move in a horizontal direction, a rotating portion connected to the moving portion and configured to rotate, a storage container which is immersed in the treating liquid accommodated at the accommodation space and having a storage space for storing substrates, and a lifting/lowering member for moving a substrate stored at the storage space and changed to the horizontal posture in an up/down position, wherein the rotating portion is configured to be mountable on the storage container for rotating the storage container, wherein the moving portion installed at the treating bath is configured to move the storage container mounted on the rotating portion in the horizontal direction, wherein a side of the storage container is opened and faces the wetting module when the storage container rotates and a posture of the substrate changes to the horizontal posture, and wherein the controller is configured to control the posture changing member, the lifting/lowering member, the transfer unit, and the wetting module such that the moving portion installed at the treating bath moves the storage container mounted on the rotating portion in the horizontal direction toward a first position where an alignment groove of the storage container is separated from a shaft of the lifting/lowering member and aligned with an upper end of the shaft of the lifting/lowering member, the upper end of the shaft of the lifting/lowering member is lifted up to be inserted into the alignment groove of the storage container at the first position and the rotating portion of the posture changing member is separated from the storage container at the first position such that the shaft of the lifting/lowering member moves the storage container at the first position in an upward direction to sequentially move one substrate at a time out of the treating liquid so that the substrate is exposed to the outside, the wetting module sprays the wetting liquid onto the substrate exposed to the outside and separated from the treating liquid, and the transfer unit transfers the substrate while the wetting liquid is being sprayed onto the substrate exposed to the outside.

2. The substrate treating apparatus of claim 1, wherein the wetting module comprises a wetting nozzle configured to spray the wetting liquid in a stream method or a spray method.

3. The substrate treating apparatus of claim 2, wherein the wetting module comprises a moving member for moving the wetting nozzle along a direction of a radius of a substrate when seen from above.

4. The substrate treating apparatus of claim 1, wherein the wetting liquid sprayed from the wetting module is a liquid which is the same as the treating liquid accommodated at the accommodation space.

5. The substrate treating apparatus of claim 1, further comprising:

a buffer part for temporarily storing a substrate, wherein the transfer unit is configured to transfer a substrate exposed to the outside and separated from the treating liquid accommodated in the accommodation space to the buffer part.

6. The substrate treating apparatus of claim 5, wherein the buffer part comprises:

a support shelf for supporting the substrate;

a wetting nozzle for spraying a wetting liquid to a substrate supported by the support shelf; and a drain partition positioned at below the substrate supported by the support shelf for draining the wetting liquid.

7. The substrate treating apparatus of claim 6, wherein the wetting nozzle is provided in plural, and wherein a first wetting nozzle among the plurality of wetting nozzles and a second wetting nozzle among the plurality of wetting nozzles face one another.

8. The substrate treating apparatus of claim 7, wherein the support shelf, and the drain partition are each provided in plural, wherein a number of the plurality of support shelves, a number of the plurality of wetting nozzles, and a number of the plurality of drain partitions are the same as a number of the plurality of substrates, wherein the transfer unit comprises a batch-type hand for transferring the plurality of substrates, and wherein a space between two adjacent substrates of the plurality of substrates gripped by the batch-type hand is the same as a space between two adjacent shelves of the plurality of support shelves.

9. The substrate treating apparatus of claim 6, wherein a wetting liquid sprayed by the wetting nozzle is a liquid which is the same type as a treating liquid accommodated at the accommodation space.

10. The substrate treating apparatus of claim 1, wherein the moving portion has a reversed U shape installed at the side portion of the treating bath, and wherein the side portion extends lengthwise in a first direction and is inserted into a space defined by the reversed U shape of the moving portion.

11. The substrate treating apparatus of claim 10, wherein the rotating portion has a rod shape extending lengthwise in a second direction perpendicular to the first direction, and wherein the rod shape is connected to the moving portion and is configured to rotate.

12. A substrate treating apparatus comprising:

a first treating part for liquid treating a plurality of substrates in a batch-type method;

a second treating part for liquid treating or dry treating one substrate in a single-type method; and a controller, wherein the first treating part comprises:

a treating bath having an accommodation space for accommodating a treating liquid;

a wetting module installed above the treating bath for spraying a wetting liquid on a substrate exposed to an outside and away from the treating liquid;

a posture changing member for changing a posture of a substrate immersed in the treating liquid from a vertical posture to a horizontal posture;

a lifting/lowering member for moving a substrate changed to the horizontal posture in an upward direction so it deviates from the treating liquid accommodated at the accommodation space to be exposed to an outside; and a plurality of storage containers having a storage space for storing a substrate, wherein the posture changing member comprises:

a moving portion installed at a side portion of the treating bath and configured to move in a horizontal direction, and a rotating portion connected to the moving portion and configured to rotate, wherein the posture changing member converts the stored substrates by rotating a first storage container among the plurality of storage containers to the horizontal posture, wherein the lifting/lowering member moves the substrate converted to the horizontal posture and stored at the first storage container to an up/down direction, wherein the second treating part comprises a buffer part for temporarily storing the substrate, wherein the first treating part further comprises a first transfer unit for transferring a substrate exposed to an outside away from the treating liquid accommodated at the accommodation space to the buffer part by the lifting/lowering member, and wherein the controller is configured to control the posture changing member, the lifting/lowering member, the first transfer unit, and the wetting module such that the moving portion installed at the side portion of the treating bath moves the first storage container mounted on the rotating portion in the horizontal direction toward a first position where an alignment groove of the first storage container is separated from a shaft of the lifting/lowering member and aligned with an upper end of the shaft of the lifting/lowering member, the upper end of the shaft of the lifting/lowering member is lifted up to be inserted into the alignment groove of the first storage container and the rotating portion of the posture changing member is separated from the first storage container such that the shaft of the lifting/lowering member moves the first storage container in an upward direction to sequentially move one substrate at a time out of the treating liquid so that the substrate is exposed to the outside, the wetting module sprays the wetting liquid onto the substrate exposed to the outside and separated from the treating liquid, and the first transfer unit transfers the substrate while the wetting liquid is being sprayed onto the substrate exposed to the outside.

13. The substrate treating apparatus of claim 12, wherein the second treating part comprises:

a single-type treating chamber for treating the substrate in the single-type method; and a second transfer unit for transferring the substrate between the buffer part and the single-type treating chamber, and wherein the second transfer unit comprises a plurality of transfer hands for transferring the single-type treating chamber by taking out the plurality of substrates from the buffer part.

14. The substrate treating apparatus of claim 13, wherein the buffer part is positioned to be stacked with the single-type treating chamber for treating the substrate in the single-type method, and positioned above the single-type treating chamber.

15. A substrate treating apparatus comprising:

a first treating part for liquid treating a plurality of substrates in a batch-type method;

a second treating part for treating a substrate treated at the first treating part and for liquid treating or dry treating one substrate in a single-type method; and a controller configured to control the first treating part and the second treating part, wherein the first treating part comprises:

a plurality of treating baths having an accommodation space for accommodating a treating liquid;

a posture changing member for changing a posture of a substrate immersed in the treating liquid from a vertical posture to a horizontal posture, wherein the posture changing member comprises:

a moving portion installed at a side portion of each treating bath of the plurality of treating baths and configured to move in a horizontal direction, and a rotating portion connected to the moving portion and configured to rotate; and a wetting module installed above each of the plurality of treating baths and spraying a wetting liquid to a substrate exposed to an outside and away from a treating liquid accommodated at the accommodation space, wherein a treating liquid accommodated at a first treating bath of among the plurality of treating baths is the same type as a wetting liquid sprayed by the wetting module, wherein a treating liquid accommodated at other treating bath, different from the first treating bath, among the plurality of treating baths is different from the wetting liquid sprayed by the wetting module, wherein the second treating part further comprises a buffer part for temporarily storing a substrate, wherein the first treating part comprises:

a storage container having a storage space immersed in the treating liquid accommodated at the accommodation space and rotated by the posture changing member;

a lifting/lowering member for moving the storage container rotated by the posture changing member in an up/down direction; and a transfer unit having a hand for transferring the substrate, and wherein the controller is configured to control the posture changing member, the lifting/lowering member, the transfer unit, and the wetting module such that the moving portion installed at the treating bath moves the storage container mounted on the rotating portion in the horizontal direction toward a first position where an alignment groove of the storage container is separated from a shaft of the lifting/lowering member and aligned with an upper end of the shaft of the lifting/lowering member, the upper end of the shaft of the lifting/lowering member is lifted up to be inserted into the alignment groove of the storage container at the first position and the rotating portion of the posture changing member is separated from the storage container at the first position such that the shaft of the lifting/lowering member moves the storage container in an upward direction to sequentially move one substrate at a time out of the treating liquid so that the substrate is exposed to the outside, the wetting module sprays the wetting liquid onto the substrate exposed to the outside and separated from the treating liquid, and the transfer unit transfers the substrate while the wetting liquid is being sprayed onto the substrate exposed to the outside.

16. The substrate treating apparatus of claim 15, wherein the hand is a batch-type hand, and wherein the buffer part comprises:

a plurality of support shelves;

second wetting nozzles for spraying the wetting liquid to each substrate supported by the plurality of support shelves;

drain partitions positioned below each substrate supported by a support shelf and draining the wetting liquid; and a sensor installed at the support shelf and sensing whether the substrate is supported.

* * * * *